(12) United States Patent
Noh

(10) Patent No.: US 12,444,700 B2
(45) Date of Patent: Oct. 14, 2025

(54) SEMICONDUCTOR DEVICE, SEMICONDUCTOR PACKAGE, AND MEMORY SYSTEM

(71) Applicant: Samsung Electronics Co., Ltd., Suwon-si (KR)

(72) Inventor: Kwangsook Noh, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 396 days.

(21) Appl. No.: 17/973,731

(22) Filed: Oct. 26, 2022

(65) Prior Publication Data

US 2023/0154871 A1 May 18, 2023

(30) Foreign Application Priority Data

Nov. 16, 2021 (KR) .......................... 10-2021-0157518

(51) Int. Cl.
*H01L 23/64* (2006.01)
*H01L 23/00* (2006.01)
(Continued)

(52) U.S. Cl.
CPC .......... *H01L 23/645* (2013.01); *H01L 23/481* (2013.01); *H01L 24/16* (2013.01);
(Continued)

(58) Field of Classification Search
CPC ..... H01L 23/645; H01L 23/481; H01L 24/16; H01L 24/73; H01L 25/0652
See application file for complete search history.

(56) References Cited

U.S. PATENT DOCUMENTS 7,859,115 B2 12/2010 Kim et al.
9,269,485 B2 2/2016 Chang et al.
(Continued)

FOREIGN PATENT DOCUMENTS

JP 2010-171092 A 8/2010
JP 2012-156186 A 8/2012
JP 2014-522561 A 9/2014

OTHER PUBLICATIONS

Changhyun Lee, et al. "Transceiver with inductive coupling for wireless chip-to-chip communication using a 50-nmdigital CMOS process," Microelectronics Journal 44 (2013), pp. 852-859, Aug. 13, 2013.

(Continued)

*Primary Examiner* — Thao P Le
(74) *Attorney, Agent, or Firm* — Harness, Dickey & Pierce, P.L.C.

(57) ABSTRACT

A semiconductor device includes an element region including a semiconductor substrate and a plurality of elements formed on the semiconductor substrate and a wiring region disposed on the element region and including an interlayer insulating layer, a plurality of wiring patterns in the interlayer insulating layer, and a via structure extending in a first direction, perpendicular to an upper surface of the semiconductor substrate in the interlayer insulating layer, wherein the plurality of elements include a first input/output circuit transmitting and receiving a first signal and a second I/O circuit transmitting and receiving a second signal, different from the first signal, the plurality of wiring patterns is a coil pattern includes an inductor circuit, the coil pattern is connected to the first I/O circuit, and the via structure passes through a center of the coil pattern and is connected to the second I/O circuit.

20 Claims, 19 Drawing Sheets

(51) Int. Cl.
*H01L 23/48* (2006.01)
*H01L 25/065* (2023.01)

(52) U.S. Cl.
CPC .............. *H01L 24/32* (2013.01); *H01L 24/73* (2013.01); *H01L 25/0652* (2013.01); *H01L 25/0657* (2013.01); *H01L 2224/16146* (2013.01); *H01L 2224/16225* (2013.01); *H01L 2224/32145* (2013.01); *H01L 2224/32225* (2013.01); *H01L 2224/73204* (2013.01); *H01L 2225/06513* (2013.01); *H01L 2225/06517* (2013.01); *H01L 2225/06524* (2013.01); *H01L 2225/06544* (2013.01); *H01L 2924/1432* (2013.01); *H01L 2924/14335* (2013.01); *H01L 2924/1436* (2013.01); *H01L 2924/30107* (2013.01)

(56) References Cited

U.S. PATENT DOCUMENTS

| | | | |
|---|---|---|---|
| 10,121,739 | B1 | 11/2018 | Kirby |
| 10,134,671 | B1 | 11/2018 | Kirby |
| 2011/0215451 | A1* | 9/2011 | Yim ........................ H01L 24/73 |
| | | | 257/E25.027 |
| 2013/0001798 | A1* | 1/2013 | Choi ........................ H01L 24/17 |
| | | | 257/774 |
| 2015/0364532 | A1 | 12/2015 | Lin et al. |
| 2018/0323369 | A1 | 11/2018 | Kirby |
| 2019/0051454 | A1 | 2/2019 | Suo et al. |
| 2021/0035905 | A1 | 2/2021 | Shih |
| 2021/0272906 | A1* | 9/2021 | Kim .................... H01L 23/5389 |
| 2021/0407923 | A1* | 12/2021 | Kim ........................ H01L 25/16 |
| 2022/0320053 | A1* | 10/2022 | Lee ...................... H01L 23/5389 |
| 2023/0118422 | A1* | 4/2023 | Kim ...................... H01L 23/645 |
| | | | 257/773 |
| 2024/0170464 | A1* | 5/2024 | Jo ...................... H01L 23/49822 |
| 2024/0371730 | A1* | 11/2024 | Lee ........................ H01L 25/50 |
| 2024/0421034 | A1* | 12/2024 | Kim .................... H01L 23/5389 |
| 2025/0038095 | A1* | 1/2025 | Lee ........................ H01L 24/13 |
| 2025/0062241 | A1* | 2/2025 | Mun ........................ H01L 25/50 |

OTHER PUBLICATIONS

Office Action issued on Aug. 6, 2025 in Korean Application No. 10-2021-0157518.

* cited by examiner

SEMICONDUCTOR DEVICE, SEMICONDUCTOR PACKAGE, AND MEMORY SYSTEM

CROSS-REFERENCE TO RELATED APPLICATION(S)

This application claims benefit of priority to Korean Patent Application No. 10-2021-0157518 filed on Nov. 16, 2021 in the Korean Intellectual Property Office, the disclosure of which is incorporated herein by reference in its entirety.

BACKGROUND

The present inventive concepts relate to a semiconductor device, a semiconductor package, and/or a memory system.

A semiconductor device may include pads connected to another external semiconductor device, and the pads are included in the semiconductor device and may be connected to an input/output (I/O) circuit including at least one of a transmitter and a receiver. Such a semiconductor device may transmit and receive signals to and from other semiconductor devices through the pads. In general, the pads of different semiconductor devices are physically connected to each other to send and receive signals, and recently, a method of forming a coil in pads and letting semiconductor devices exchange signals using electromagnetic induction due to current flowing through the coil has been actively researched.

SUMMARY

Some example embodiments of the present inventive concepts provide a semiconductor device, a semiconductor package, and/or a memory system, in which input/output (I/O) circuits of different semiconductor devices are connected to each other using a via structure passing through the center of a coil pattern for exchanging signals, and a different signal is exchanged with the coil pattern through the via structure, thereby improving the degree of integration and performance.

According to an example embodiment of the present inventive concepts, a semiconductor device includes an element region including a semiconductor substrate and a plurality of elements formed on the semiconductor substrate and a wiring region disposed on the element region and including an interlayer insulating layer, a plurality of wiring patterns in the interlayer insulating layer, and a via structure extending in a first direction, perpendicular to an upper surface of the semiconductor substrate, in the interlayer insulating layer, wherein the plurality of elements includes a first input/output (I/O) circuit transmitting and receiving a first signal and a second I/O circuit transmitting and receiving a second signal, different from the first signal, the plurality of wiring patterns is a coil pattern includes an inductor circuit, the coil pattern is connected to the first I/O circuit, and the via structure passes through a center of the coil pattern and is connected to the second I/O circuit.

According to an example embodiment of the present inventive concepts, a semiconductor package includes a package substrate and a first semiconductor device and a second semiconductor device stacked in a first direction, perpendicular to an upper surface of the package substrate, wherein each of the first semiconductor device and the second semiconductor device includes a semiconductor substrate, a plurality of via structures passing through the semiconductor substrate, a coil pattern surrounding at least one via structure of the plurality of via structures in a second direction, parallel to an upper surface of the semiconductor substrate, and an input/output (I/O) circuit connected to at least one of the plurality of via structures and the coil pattern, the at least one via structure provides a transmission path of a first signal, and the coil pattern provides a transmission path of a second signal, different from the first signal.

According to an example embodiment of the present inventive concepts, a memory system includes a printed circuit board (PCB), a host device on the PCB, and a memory package on the PCB, the memory package including a plurality of memory devices stacked on each other, and connected to the host device, wherein the plurality of memory devices includes a plurality of through-silicon vias (TSVs) and a plurality of coil patterns surrounding at least one of the plurality of TSVs, and the plurality of memory devices exchange signals with the host device through the plurality of TSVs and the plurality of coil patterns.

BRIEF DESCRIPTION OF DRAWINGS

The above and other example embodiments, features, and advantages of the present inventive concepts will be more clearly understood from the following detailed description, taken in conjunction with the accompanying drawings, in which.

DETAILED DESCRIPTION

Hereinafter, example embodiments of the present inventive concepts will be described with reference to the accompanying drawings.

Figure 1:
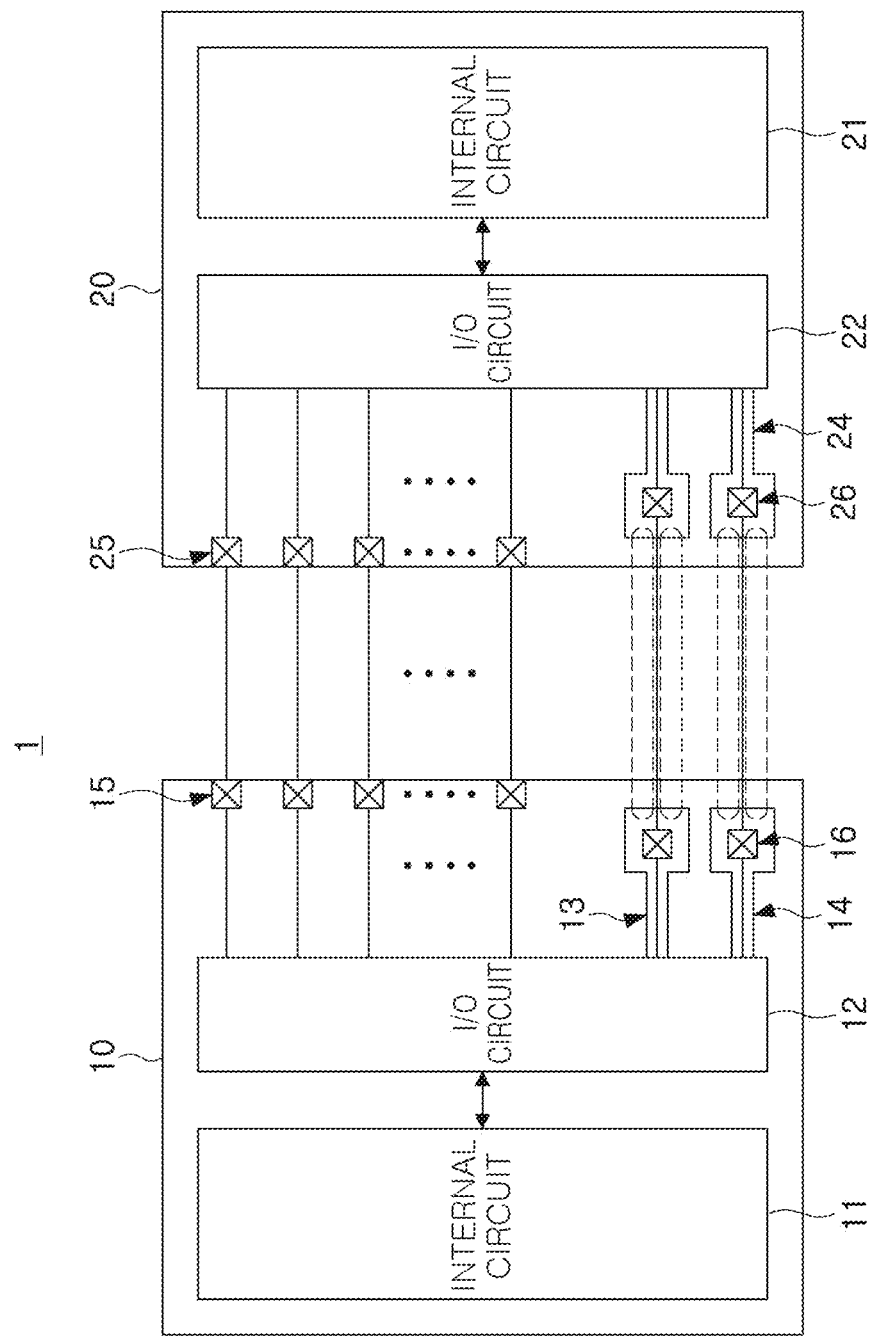
FIG. 1 is a schematic block diagram illustrating a system including a semiconductor device according to an example embodiment of the present inventive concepts.

FIG. 1 is a schematic block diagram illustrating a system including a semiconductor device according to an example embodiment of the present inventive concepts.

Referring to FIG. 1, a system 1 according to an example embodiment of the present inventive concepts may include a first semiconductor device 10 and a second semiconductor device 20. The first semiconductor device 10 and the second semiconductor device may be connected to each other for communication with each other. The first semiconductor device 10 and the second semiconductor device 20 may be communicatively coupled to each other. The first semiconductor device 10 may include an internal circuit 11, an input/output (I/O) circuit 12, a plurality of coil patterns 13 and 14, and a plurality of pads 15 and 16. The second semiconductor device 20 may include an internal circuit 21, an I/O circuit 22, a plurality of coil patterns 23 and 24, and a plurality of pads 25 and 26.

In an example embodiment, the internal circuit 11 of the first semiconductor device 10 and the internal circuit 21 of the second semiconductor device 20 may have different structures and may perform different functions. For example, when the first semiconductor device 10 is an application processor, the internal circuit 11 may include a CPU, GPU, DSP, NPU, a memory interface, a display interface, a power circuit, and the like. When the second semiconductor device 20 is a memory device connected to an application processor, the internal circuit 11 may include a memory cell array in which memory cells are disposed and peripheral circuits controlling the memory cell array.

The first semiconductor device 10 and the second semiconductor device 20 may transmit and receive signals through a plurality of coil patterns 13, 14, 23, and 24. For example, the plurality of coil patterns 13, 14, 23, and 24 may be inductor circuits provided by internal wiring patterns of the first semiconductor device 10 and the second semiconductor device 20. The first semiconductor device 10 and the second semiconductor device 20 may transmit and receive signals using electromagnetic induction between a pair of coil patterns 13, 14, 23, and 24 coupled to each other.

Also, the first semiconductor device 10 and the second semiconductor device 20 may exchange signals with each other through the plurality of pads 15, 16, 25, and 26. For example, the first semiconductor device 10 and the second semiconductor device 20 may be stacked on each other, and the plurality of pads 15 and 16 included in the first semiconductor device 10 may be connected to the plurality of pads 25 and 26 included in the second semiconductor device 20 via structures. The first semiconductor device 10 and the second semiconductor device 20 may exchange signals with each other through the via structures.

In an example embodiment illustrated in FIG. 1, some pads 16, 26 among the plurality of pads 15, 16, 25, and 26 may be disposed in the center of the coil patterns 13, 14, 23 and 24. Via structures connecting the pads 16 and 26 to each other may pass through the center of the coil patterns 13, 14, 23, and 24.

The pads 16 and 26 may transmit signals like other pads 15 and 26. In an example embodiment, when the first semiconductor device 10 is an application processor and the second semiconductor device 20 is a memory device, the first semiconductor device 10 may transmit a power voltage required for an operation of the second semiconductor device 20, together with signals such as a data signal, a system clock signal, and a data strobe signal, to the second semiconductor device 20. For example, the first semiconductor device 10 and the second semiconductor device 20 may exchange data signals through the coil patterns 13, 14, 23, and 24. Meanwhile, the first semiconductor device 10 may supply a power voltage to the second semiconductor device 20 through some pads 16 and 26 disposed in the centers of the coil patterns 13, 14, 23, and 24.

However, this is only an example embodiment, and the first semiconductor device 10 and the second semiconductor device 20 may exchange signals other than the power voltage through some pads 16 and 26 disposed in the center of the coil patterns 13, 14, 23 and 24. In this manner, in an example embodiment of the present inventive concepts, the pads 16 and 26 may be disposed in the center of the coil patterns 13, 14, 23 and 24, and the pads 16 and 26 are connected to the via structure and used as a signal transmission path. Accordingly, a signal transmission path between the semiconductor devices 10 and 20 may be effectively secured, and the degree of integration of each of the semiconductor devices 10 and 20 may be improved.

Figure 2A:
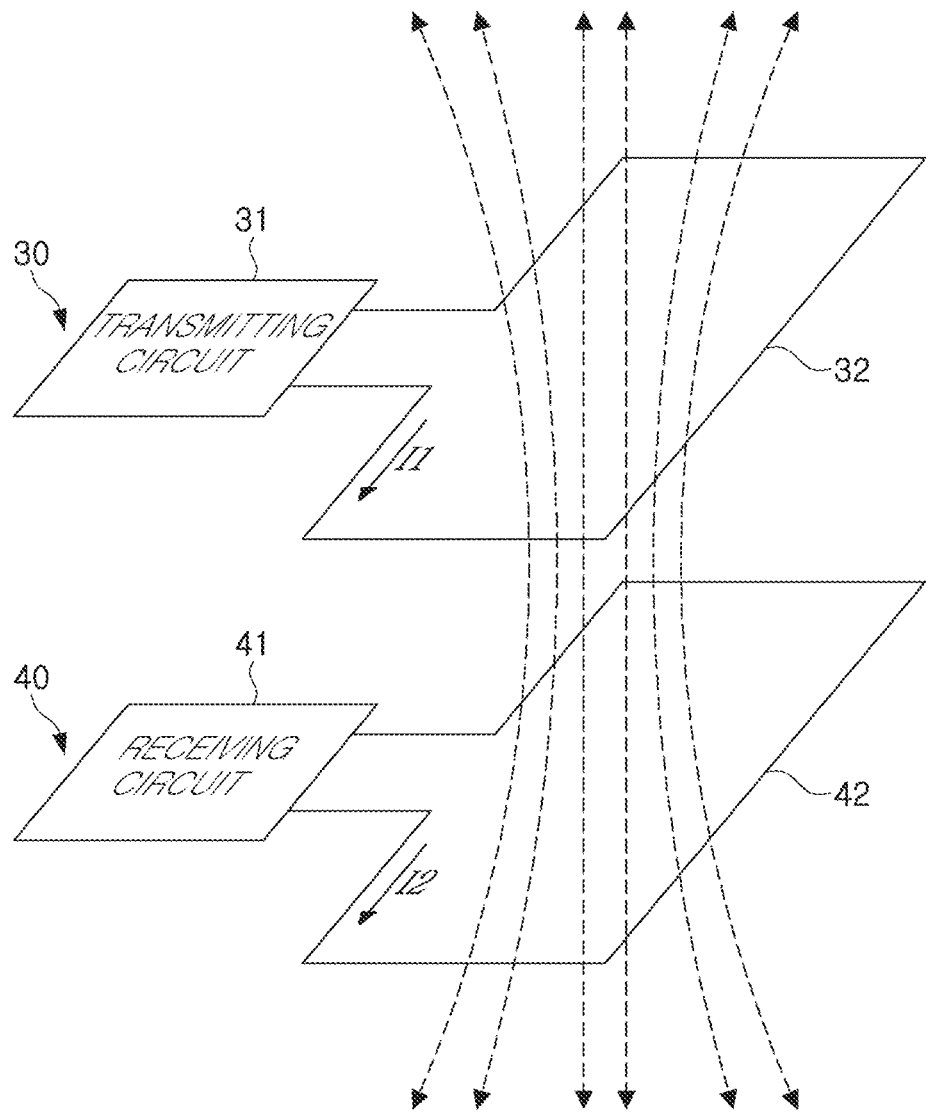
FIGS. 2A and 2B are diagrams illustrating an operation of a semiconductor device according to an example embodiment of the present inventive concepts.
Figure 2B:
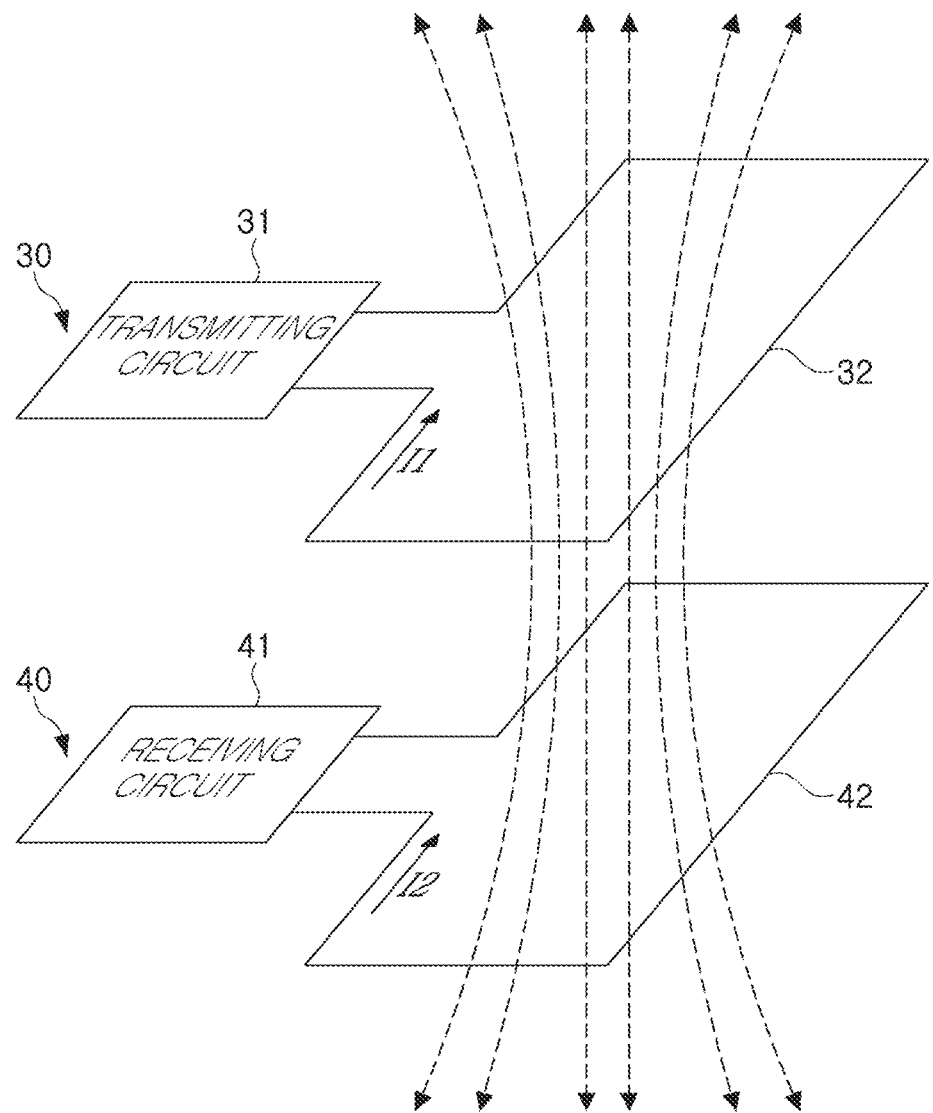

FIGS. 2A and 2B are diagrams illustrating an operation of a semiconductor device according to an example embodiment of the present inventive concepts.

Referring to FIGS. 2A and 2B, a first semiconductor device 30 and a second semiconductor device 40 according to an example embodiment of the present inventive concepts may exchange signals with each other using electromagnetic induction due to current flowing through the coil patterns 32 and 42. In the example embodiments illustrated in FIGS. 2A and 2B, the first semiconductor device 30 transmits a signal and the second semiconductor device 40 receives the signal, but conversely, the second semiconductor device 40 may transmit a signal, and the first semiconductor device 30 may receive the signal.

Referring to FIGS. 2A and 2B, a transmitting circuit 31 may be connected to the coil pattern 32 in the first semiconductor device 30, and a receiving circuit 41 may be connected to the coil pattern 42 in the second semiconductor device 40. Referring to FIG. 2A, the transmitting circuit 31 may apply a first current I1 flowing in a first direction to the coil pattern 32. When the first current I1 flows through the coil pattern 32, electromagnetic induction may occur in the coil patterns 32 and 42 coupled to each other as illustrated in FIG. 2A, and a voltage may be induced to both ends of the coil pattern 42 of the second semiconductor device 40. Also, the second current I2 may flow through the coil pattern 42 in the first direction.

Next, referring to FIG. 2B, the transmitting circuit 31 may apply a first current I1 flowing in a second direction opposite to the first direction to the coil pattern 32. For example, in the example embodiments illustrated in FIGS. 2A and 2B, the first direction may be a counterclockwise direction, and the second direction may be a clockwise direction. When the first current I1 flows through the coil pattern 32 in the second direction, electromagnetic induction may occur in the coil patterns 32 and 42 coupled to each other and a voltage may be induced to both ends of the coil pattern 42 of the second semiconductor device 40. Also, a second current I2 flowing in the second direction may be induced through the coil pattern 42.

The receiving circuit 41 of the second semiconductor device 40 may determine data included in the signal transmitted by the first semiconductor device 30 based on the voltage induced in the coil pattern 42. For example, when data '0' is to be transmitted, a voltage may be applied to both ends of the coil pattern so that the first current I1 may flow in the first direction in the coil pattern 32. Conversely, when data '1' is to be transmitted, a voltage may be applied to both ends of the coil pattern 32 so that the first current I1 may flow in the second direction in the coil pattern 31.

The voltage induced in the coil pattern 42 of the second semiconductor device 40 may vary according to a direction of the first current I1 flowing in the coil pattern 32 of the first semiconductor device 30. Accordingly, the receiving circuit 41 of the second semiconductor device 40 may determine data included in the signal transmitted by the first semiconductor device 30 based on the voltage induced in the coil pattern 42.

Figure 3:
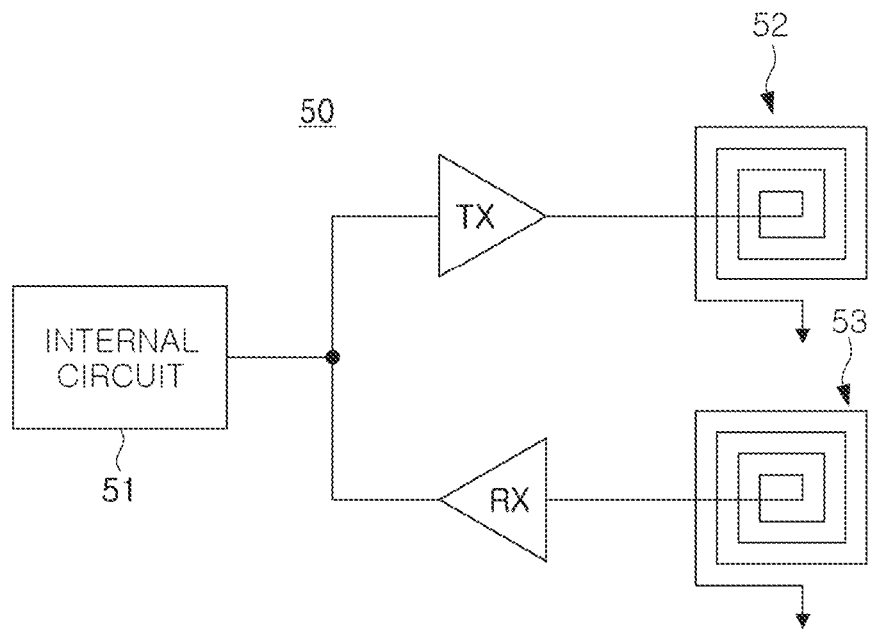
FIGS. 3 and 4 are diagrams schematically illustrating a semiconductor device according to an example embodiment of the present inventive concepts.
Figure 4:
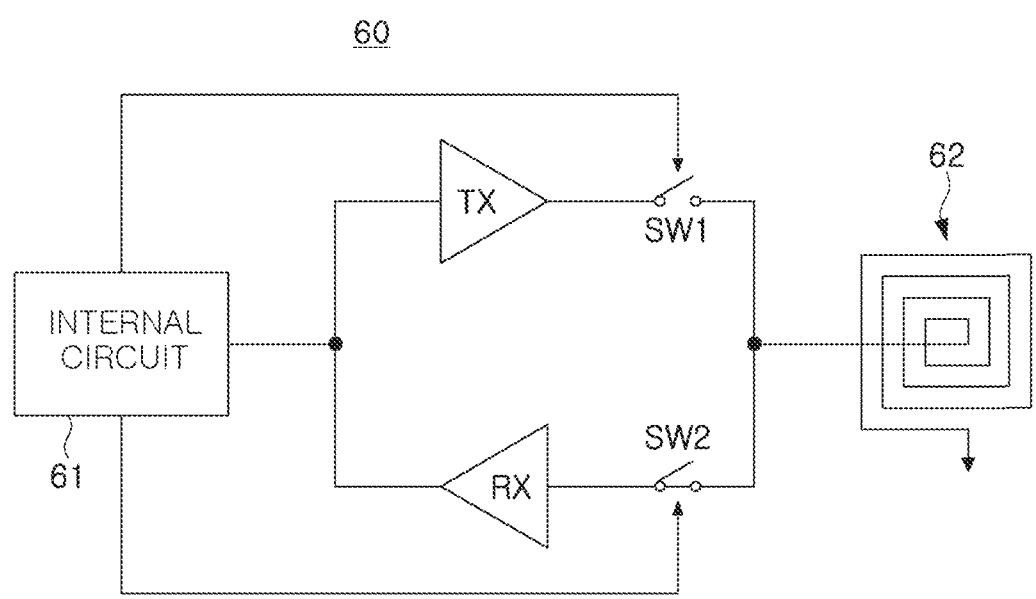

FIGS. 3 and 4 are diagrams schematically illustrating a semiconductor device according to an example embodiment of the present inventive concepts.

First, referring to FIG. 3, a semiconductor device 50 according to an example embodiment of the present inventive concepts may include an internal circuit 51, a transmitter Tx, a receiver Rx, and a plurality of coil patterns 52 and 53. The plurality of coil patterns 52 and 53 may include a first coil pattern 52 connected to an output terminal of the transmitter Tx and a second coil pattern 53 connected to an input terminal of the receiver Rx.

The internal circuit 51 may include a plurality of circuits for implementing a function of the semiconductor device 50. For example, when the semiconductor device 50 is a memory device, the internal circuit 51 may include a power supply circuit, a decoder circuit, a page buffer, a memory cell array, and the like. When the semiconductor device 50 is an application processor, the internal circuit 51 may include a core, a GPU, a DSP, a memory controller, a power supply circuit, and the like.

The internal circuit 51 may output a signal to an external semiconductor device through the transmitter Tx and the first coil pattern 52. The internal circuit 51 may output a desired signal by controlling a direction of a current flowing through the first coil pattern 52 through the transmitter Tx. An induced voltage may be generated in a coil pattern included in another semiconductor device adjacent to the semiconductor device 50 according to a current flowing through the first coil pattern 52. In an example embodiment, an internal circuit of the another semiconductor device may receive a signal output by the semiconductor device 50 by comparing the induced voltage with a predetermined reference voltage.

Also, the internal circuit 51 may receive a signal from another external semiconductor device through the receiver Rx and the second coil pattern 53. An induced voltage may be generated in the second coil pattern 53 due to a current flowing through a coil pattern of the other external semiconductor device. The receiver Rx may compare the induced voltage generated in the second coil pattern 53 with a predetermined reference voltage, and the internal circuit 51 may receive a signal output from the another semiconductor device.

In the example embodiment illustrated in FIG. 3, the first coil pattern 52 may be connected to the transmitter Tx and the second coil pattern 53 may be connected to the receiver Rx. Meanwhile, in the semiconductor device 60 according to the example embodiment illustrated in FIG. 4, a single coil pattern 62 may be connected to an output terminal of a transmitter Tx and an input terminal of a receiver Rx. Therefore, in the example embodiment illustrated in FIG. 4, the semiconductor device 60 may include a first switch SW1 and a second switch SW2 so that the coil pattern 62 is not simultaneously connected to the transmitter Tx and the receiver Rx.

The first switch SW1 may be a transmission switch connected between the output terminal of the transmitter Tx and the coil pattern 62. Meanwhile, the second switch SW2 may be a reception switch connected between the input terminal of the receiver Rx and the coil pattern 62. Each of the first switch SW1 and the second switch SW2 is turned on and turned off by an internal circuit 61, and the first switch SW1 and the second switch SW2 may not be simultaneously turned on.

In the case of outputting a signal to another semiconductor device, the internal circuit 61 may turn on the first switch SW1 and turn off the second switch SW2 to connect the coil pattern 62 to the output terminal of the transmitter Tx. Meanwhile, in the case of receiving a signal from another semiconductor device, the internal circuit 61 may turn off the first switch SW1 and turn on the second switch SW2 to connect the coil pattern (62) to the input terminal of the receiver Rx.

FIGS. 5 to 9 are diagrams schematically illustrating a semiconductor package according to an example embodiment of the present inventive concepts.

Figure 5:
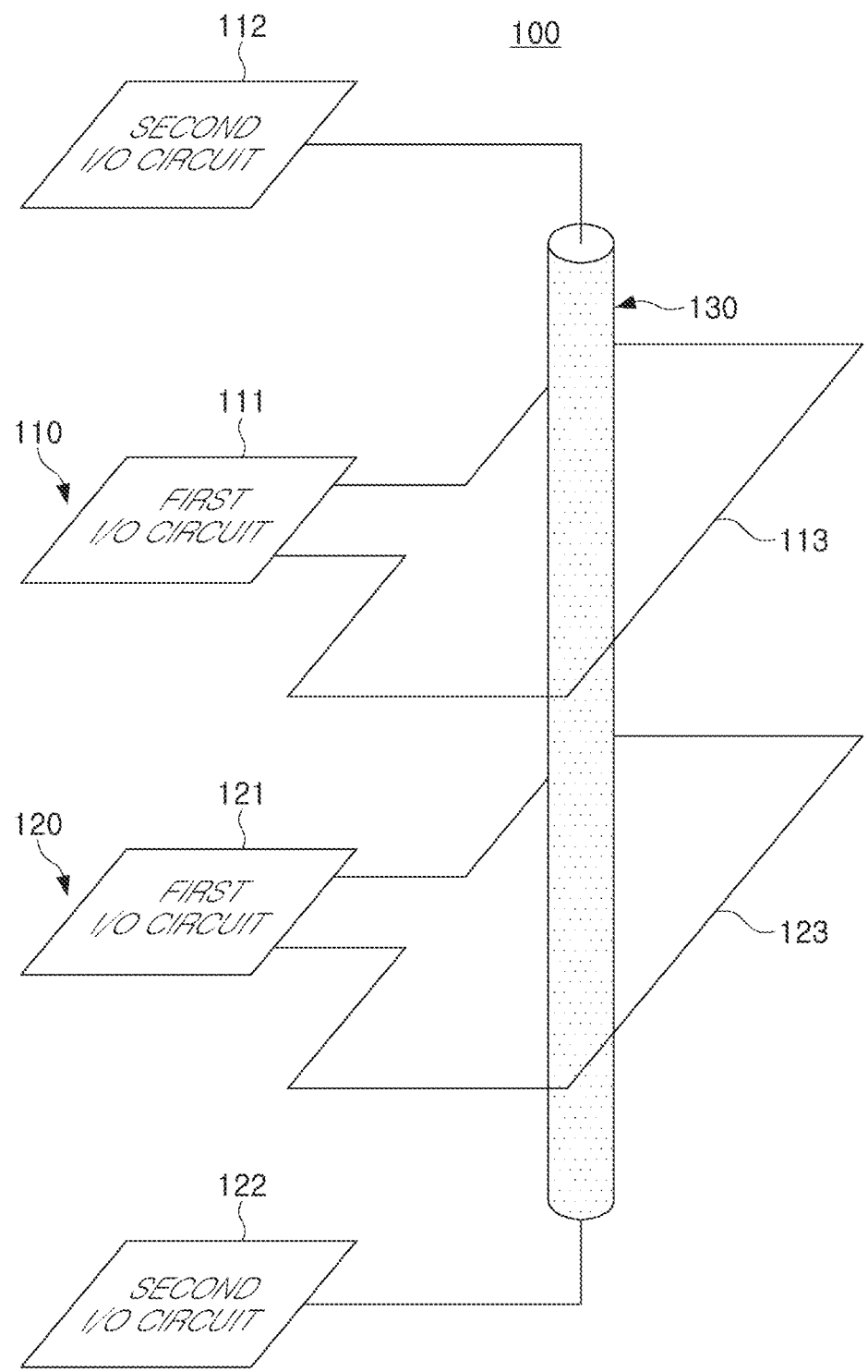
FIGS. 5 to 9 are diagrams schematically illustrating a semiconductor package according to an example embodiment of the present inventive concepts.

Referring to FIG. 5, a semiconductor package 100 according to an example embodiment may include a first semiconductor device 110 and a second semiconductor device 120, and the first semiconductor device 110 and the second semiconductor device 120 may be stacked each other. The first semiconductor device 110 and the second semiconductor device 120 may include the I/O circuits 111, 112, 121, and 122, coil patterns 113 and 123 connected to the first I/O circuits 111 and 121, and a via structure 130 connected to the second I/O circuits 112 and 122.

The I/O circuits 111, 112, 121, and 122 of the first semiconductor device 110 and the second semiconductor device 120 may include a transmitter, a receiver, and a sampling circuit. Meanwhile, the coil patterns 113 and 123 may be connected to an output terminal of a transmitter and an input terminal of a receiver included in the first I/O circuits 111 and 121, and the coil pattern 113 of the first semiconductor device 110 may be aligned with the coil pattern 123 of the semiconductor device 120.

Accordingly, an induced voltage may be generated in the coil pattern 123 of the second semiconductor device 120 due to the current flowing in the coil pattern 113 of the first semiconductor device 110, and conversely, an induced voltage may be generated in the coil pattern 113 of the first semiconductor device 110 due to the current flowing in the coil pattern 123 of the second semiconductor device 120. In the example embodiment illustrated in FIG. 5, each of the coil patterns 113 and 123 is simply illustrated. However, the shape and number of turns of the coil patterns 113 and 123 may be variously modified, unlike those illustrated in FIG. 5.

Referring to FIG. 5, the semiconductor package 100 may include the via structure 130 passing through the center of the coil patterns 113 and 123. The via structure 130 may extend in a direction in which the first semiconductor device 110 and the second semiconductor device 120 are stacked. Also, the via structure 130 may provide a signal transmission path between the first semiconductor device 110 and the second semiconductor device 120. In other words, the first semiconductor device 110 and the second semiconductor device 120 may transmit and receive signals through the via structure 130. In an example embodiment, the via structure 130 may be connected to the second I/O circuits 112 and 122, and a transmitter and a receiver included in the second I/O circuits 112 and 122 may output or receive a signal through the via structure 130.

For example, the via structure 130 may be a through-silicon via (TSV) passing through the semiconductor substrate included in the first semiconductor device 110. In addition, the via structure 130 may be formed of a material having a low resistivity so that a signal may be efficiently transmitted. As illustrated in FIG. 5, the via structure 130 may be disposed to pass through the center of the coil patterns 113 and 123 and the first semiconductor device 110 and the second semiconductor device 120 may be designed to exchange signals through the via structure 130, so that the degree of integration of each of the first semiconductor device 110 and the second semiconductor device 120 may be improved.

In an example embodiment, a signal transmitted through the coil patterns 113 and 123 may be different from a signal transmitted through the via structure 130. For example, the first semiconductor device 110 and the second semiconductor device 120 may transmit and receive a data signal, a data strobe signal, and the like, and may exchange a power signal through the via structure 130. However, this is only an example embodiment, and the signal transmitted through the coil patterns 113 and 123 and the signal transmitted through the via structure 130 may be variously modified.

Figure 6:
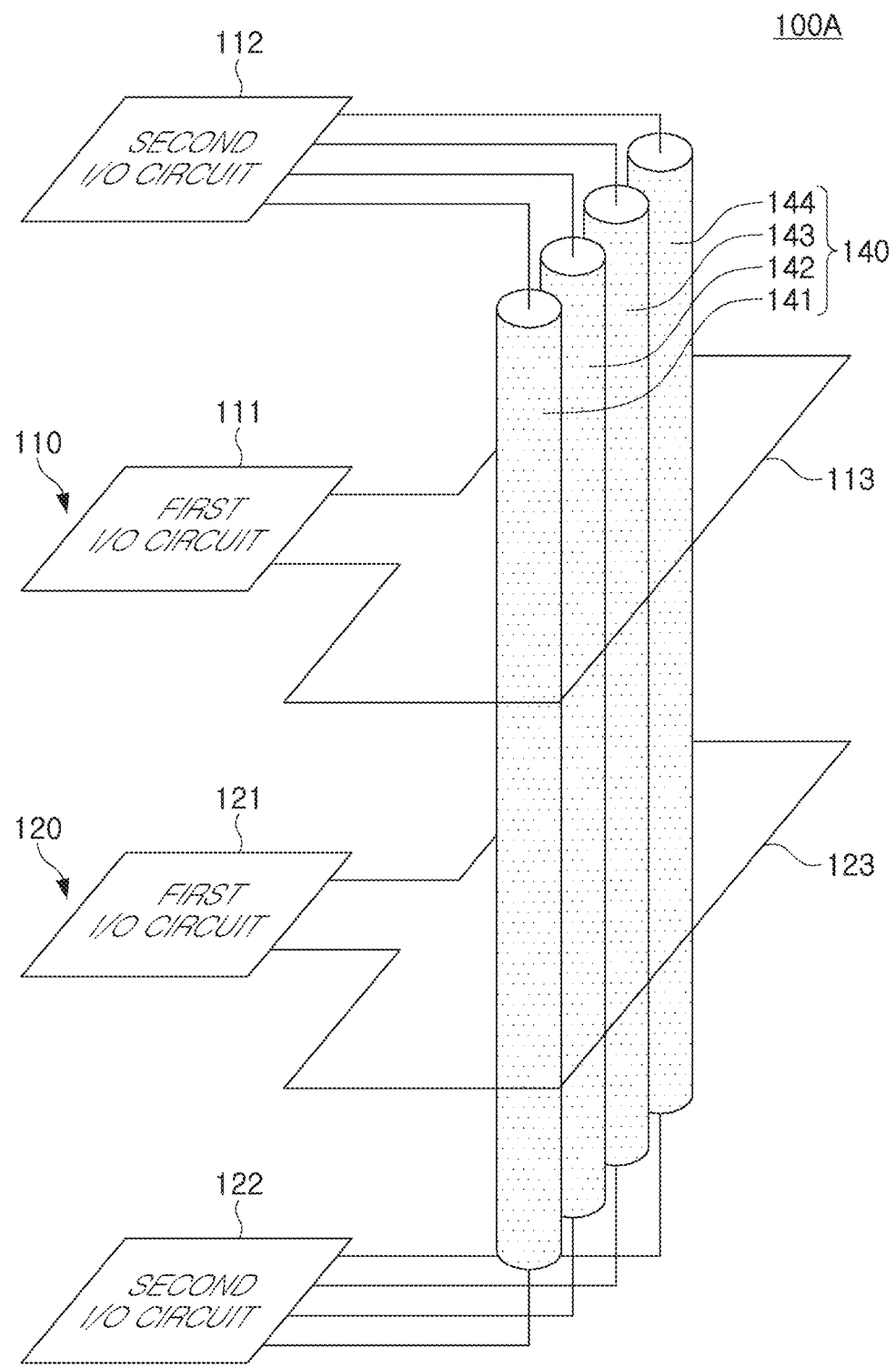

Next, referring to FIG. 6, a semiconductor package 100A according to an example embodiment of the present inventive concepts may include a first semiconductor device 110 and a second semiconductor device 120, and the first semiconductor device 110 and the second semiconductor device 110 may be stacked on each other. Each of the first semiconductor device 110 and the second semiconductor device 120 may include I/O circuits 111, 112, 121, and 122, coil patterns 113 and 123 connected to the first I/O circuits 111 and 121, and a plurality of via structures 141 to 144 (140) connected to the second I/O circuits 112 and 122, and the like. Signal transmission/reception between the first semiconductor device 110 and the second semiconductor device 120 by the operation of the first I/O circuits 111 and 121 and the coil patterns 113 and 123 may be understood based on the descriptions given above with reference to FIG. 5.

Referring to FIG. 6, the semiconductor package 100A may include a plurality of via structures 140 passing through the centers of the coil patterns 113 and 123. The plurality of via structures 140 may be connected to the second I/O circuits 112 and 122, and the second I/O circuits 112 and 122 may include a plurality of transmitters and a plurality of receivers connected to a plurality of via structures 140. Each of the plurality of via structures 140 may be arranged in one direction or may be arranged in a matrix form. The plurality of via structures 140 may have the same cross-sectional area and may be formed of a material having high conductivity.

In the example embodiment illustrated in FIG. 6, the plurality of via structures 140 adjacent to each other and surrounded by the coil patterns 113 and 123 may provide a transmission path for the same type of signal. For example, the plurality of via structures 140 may provide transmission paths for a plurality of data signals. Also, as described above, signals transmitted and received between the first semiconductor device 110 and the second semiconductor device 120 through the coil patterns 113 and 123 may be different from signals transmitted and received through the plurality of via structures 140.

Figure 7:
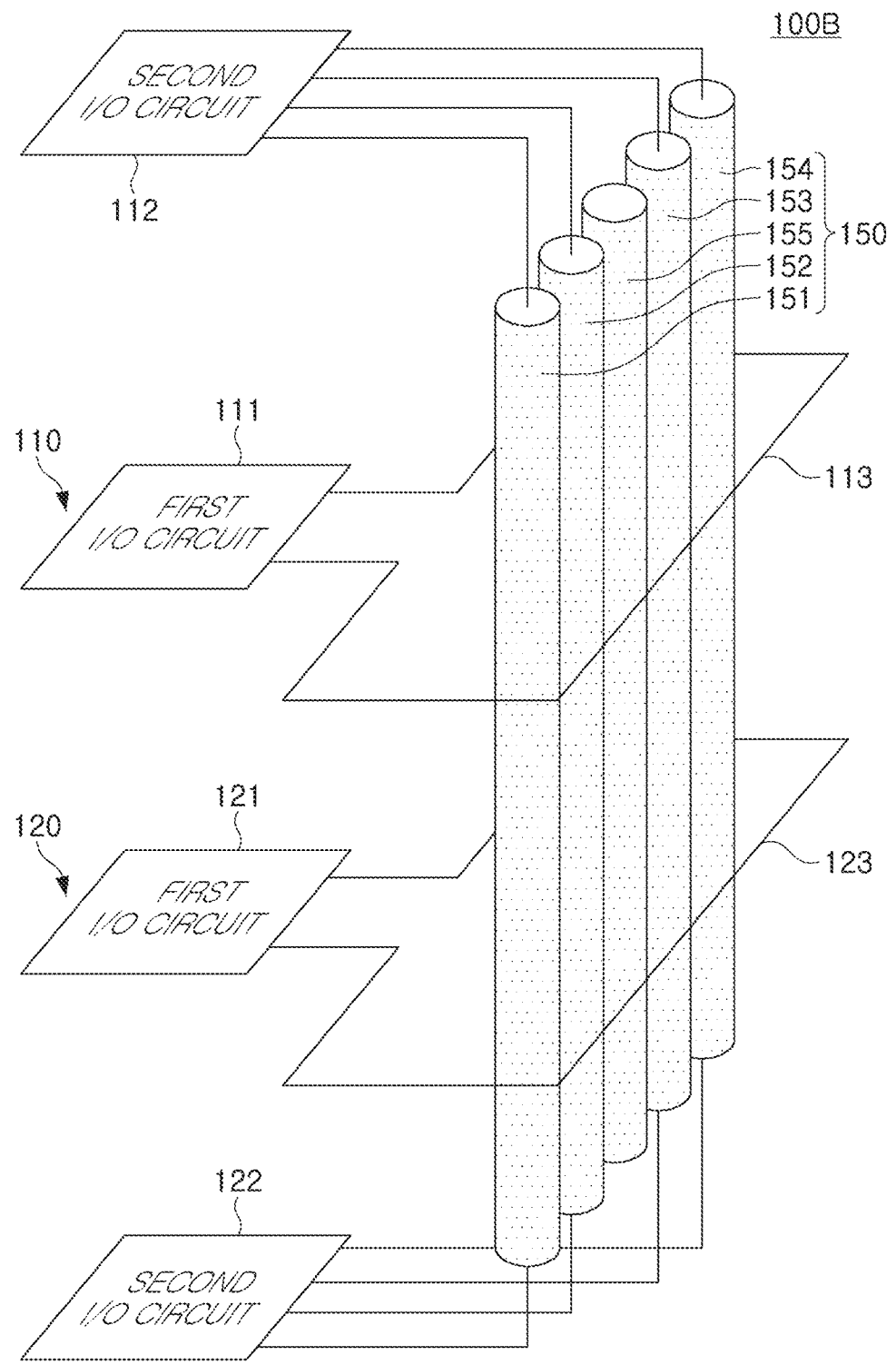

Meanwhile, referring to FIG. 7, a semiconductor package 100B according to an example embodiment may include a first semiconductor device 110 and a second semiconductor device 120 stacked on each other, and each of the first semiconductor device 110 and the second semiconductor device 120 may include I/O circuits 111, 112, 121, and 122, coil patterns 113 and 123 connected to the first I/O circuits 111 and 121, a plurality of via structures 151 to 155 (150), and the like. Signal transmission and reception by the operation of the first I/O circuits 111 and 121 and the coil patterns 112 and 122 may be the same as described above with reference to FIG. 5.

Referring to FIG. 7, the semiconductor package 100A may include the plurality of via structures 150 passing through the centers of the coil patterns 113 and 123. The plurality of via structures 150 may have the same cross-sectional area.

In an example embodiment illustrated in FIG. 7, at least one via structure 155 among the plurality of via structures 150 may be formed of a material different from that of the other via structures 151 to 154. For example, the at least one via structure 155 may be formed of a first material having ferromagnetic characteristics, and the other via structures 151 to 154 may be formed of a second material having resistivity lower than that of the first material. Accordingly, the other via structures 151 to 154 may have conductivity higher than that of the at least one via structure 155.

The first semiconductor device 110 and the second semiconductor device 120 may exchange signals with each other through the coil patterns 113 and 123 and the via structures 151 to 154. At least one via structure 155 formed of a ferromagnetic material may not be connected to the second I/O circuits 121 and 122, unlike the via structures 151 to 154. Since at least one via structure 155 formed of a ferromagnetic material is disposed to pass through the center of the coil patterns 113 and 123, a coupling coefficient may be improved without increasing a cross-sectional area of the coil patterns 113 and 123. Accordingly, signal transmission efficiency through the coil patterns 113 and 123 may be improved without degrading the degree of integration of the first semiconductor device 110 and the second semiconductor device 120.

In the example embodiment illustrated in FIG. 7, at least one via structure 155 formed of a ferromagnetic material may be disposed between the other via structures 151 to 154, and the same number of the remaining via structures 151 to 154 may be distributed and disposed on both sides of the at least one via structure 155. However, this is only an example embodiment, and an arrangement order and shape of the via structure 155 formed of the first material having ferromagnetic characteristics and the via structures 151 to 154 formed of the second material having low resistivity may be variously modified. In addition, the number of via structures 155 having ferromagnetic characteristics may also vary according to example embodiments.

Figure 8:
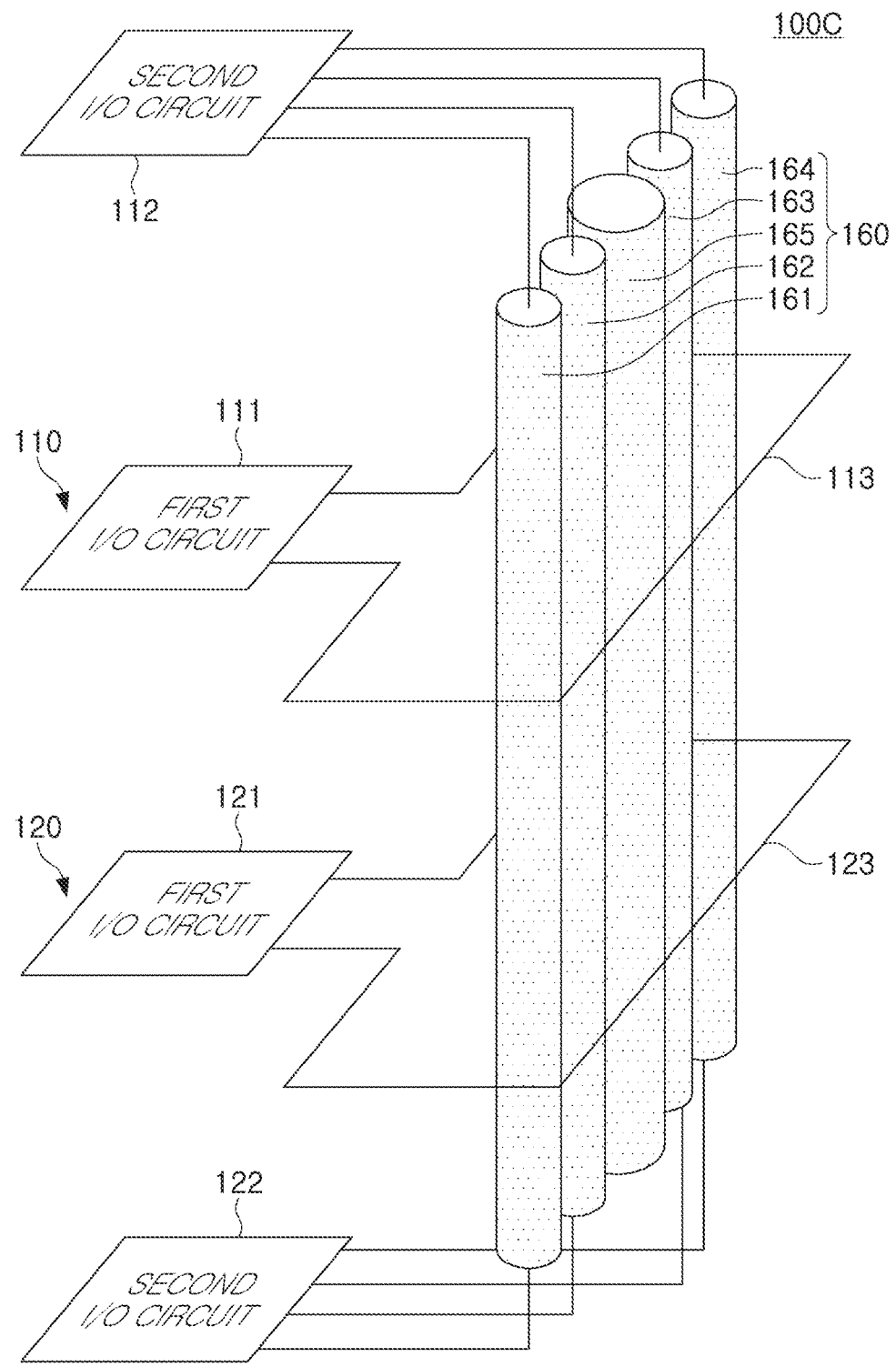

Referring to FIG. 8, a semiconductor package 100C according to an example embodiment may include a first semiconductor device 110 and a second semiconductor device 120 stacked on each other. Each of the first semiconductor device 110 and the second semiconductor device 120 may include I/O circuits 111, 112, 121, and 122 and coil patterns 113 and 123 connected to the first I/O circuits 111 and 12, and signal transmission/reception between the first semiconductor device 110 and the second semiconductor device 120 through the coil patterns 113 and 123 may be the same as described above.

Referring to FIG. 8, the semiconductor package 100C may include a plurality of via structures 161 to 165 (160) passing through the centers of the coil patterns 111 and 121. As described above with reference to FIG. 7, at least one via structure 165 of the plurality of via structures 150 may be formed of a first material having ferromagnetic characteristics, and the other via structures 151 to 154 may be formed of a second material having excellent conductivity. The other via structures 151 to 154 formed of the second material may be connected to the second I/O circuits 112 and 122.

In the example embodiment illustrated in FIG. 8, at least one via structure 165 formed of the first material may have a relatively large cross-sectional area compared to the other via structures 161 to 164. Accordingly, a coupling coefficient of the coil patterns 113 and 123 may be increased and signal transmission efficiency through the coil patterns 113 and 123 may be further improved.

Figure 9:
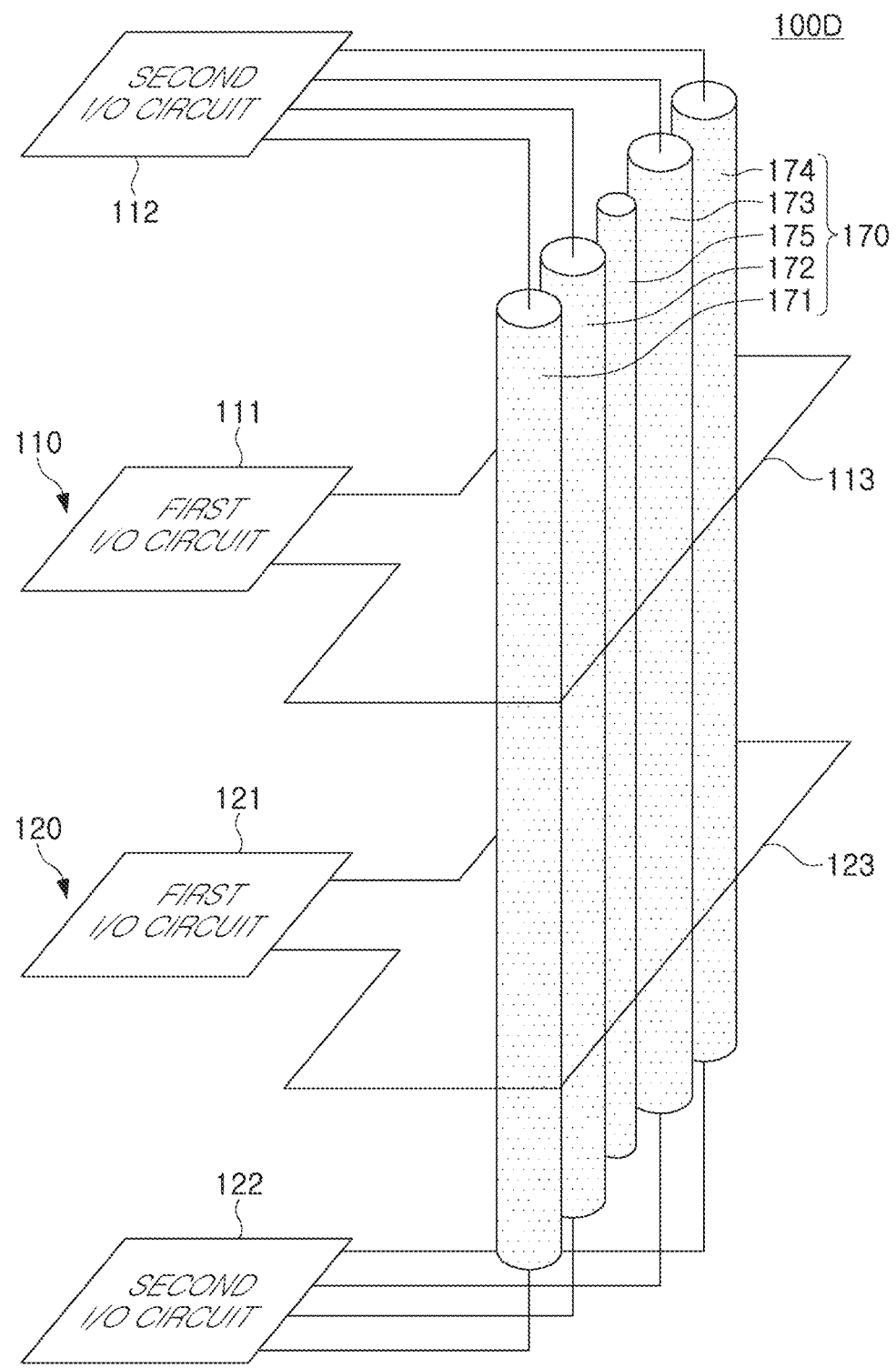

Meanwhile, in a semiconductor package 100D according to an example embodiment illustrated in FIG. 9, a via structure 175 formed of a ferromagnetic material, among a plurality of via structures 171 to 175 (170), may have a smaller cross-sectional area, compared with the other via structures 171 to 174 formed of a material having high conductivity. Accordingly, via structures 171 to 174 as many as possible may be disposed in a region formed inside the coil patterns 113 and 123 and utilized as a signal transmission path, and the degree of integration of each of the first semiconductor device 110 and the second semiconductor device 120 may be improved.

As described with reference to FIGS. 5 to 9, the first semiconductor device 110 and the second semiconductor device 120 transmit signals through the coil patterns 113 and 123 as well as exchanging signals with each other through the via structures 130, 140, 150, 160, and 170 disposed to pass through the center of the coil patterns 113 and 123. For example, through the via structures 130, 140, 150, 160, and 170, a power signal may be transmitted between the first semiconductor device 110 and the second semiconductor device 120 or a signal different from the power signal may be transmitted. This will be described in more detail with reference to FIG. 10 hereinafter.

Figure 10:
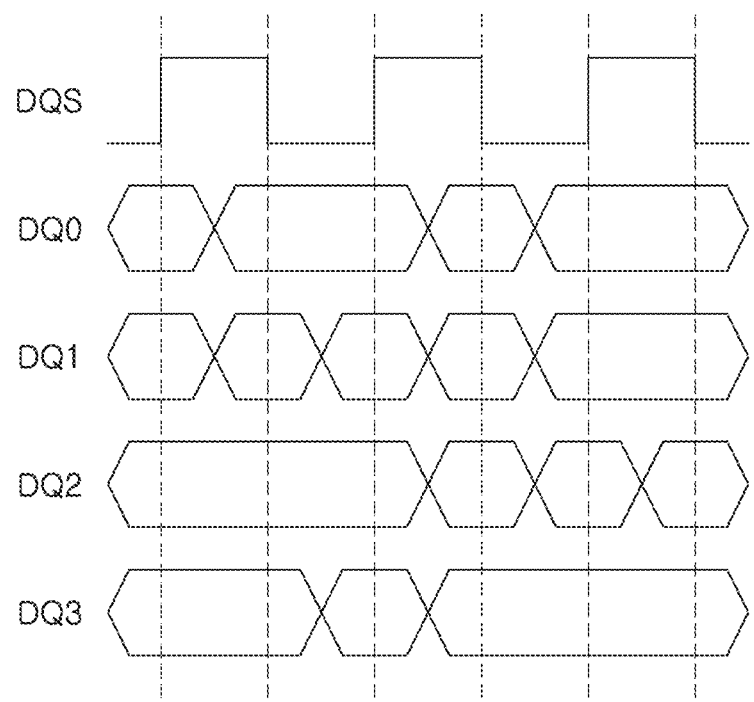
FIG. 10 is a diagram illustrating an operation of a semiconductor device according to an example embodiment of the present inventive concepts.

FIG. 10 is a diagram illustrating an operation of a semiconductor device according to an example embodiment of the present inventive concepts.

In an example embodiment illustrated in FIG. 10, a semiconductor device may exchange a data strobe signal DQS and data signals DQ0 to DQ3 with another semiconductor device. Referring to FIG. 6 together for convenience of description, the first semiconductor device 110 may be a memory device, and the second semiconductor device 120 may be a host for the memory device. The second semiconductor device 120 may transmit the data strobe signal DQS to the first semiconductor device 110 and may exchange the data signals DQ0 to DQ3 with the first semiconductor device 110. In an example embodiment, the first semiconductor device 110 may sample the data signals DQ0 to DQ3 received from the second semiconductor device 120 at a rising edge and/or a falling edge of the data strobe signal DQS received from the second semiconductor device 120.

For example, referring to FIGS. 6 and 10 together, the data strobe signal DQS may be transmitted from the second semiconductor device 120 to the first semiconductor device 110 by electromagnetic induction between the coil patterns 112 and 122. Meanwhile, a transmission path of the data signals DQ0 TO DQ3 may be provided by the via structures 140. For example, the first via structure 141 may provide a transmission path of the first data signal DQ0, the second via structure 142 may provide a transmission path of the second data signal DQ1, the third via structure 143 may provide a transmission path of the third data signal DQ2, and the fourth via structure 144 may provide a transmission path of the third data signal DQ3.

The via structures 140 may be respectively allocated to the data signals DQ0 to DQ3 like a transmission path connecting a plurality of semiconductor devices. The second semiconductor device 120 may transmit the data strobe signal DQS to the first semiconductor device 110 through the coil patterns 112 and 122 and simultaneously transmit the data signals DQ0 to DQ3 as illustrated in FIG. 10 to the first semiconductor device 110 through the via structures 140. The first semiconductor device 110 may include a receiver having an input terminal connected to the via structures 140 and a sampling circuit operating in synchronization with the data strobe signal DQS. An output terminal of the receiver may be connected to an input terminal of the sampling circuit, and the sampling circuit may sample the data signals DQ0 to DQ3 at a rising edge and/or a falling edge of the data strobe signal DQS.

Figure 11:
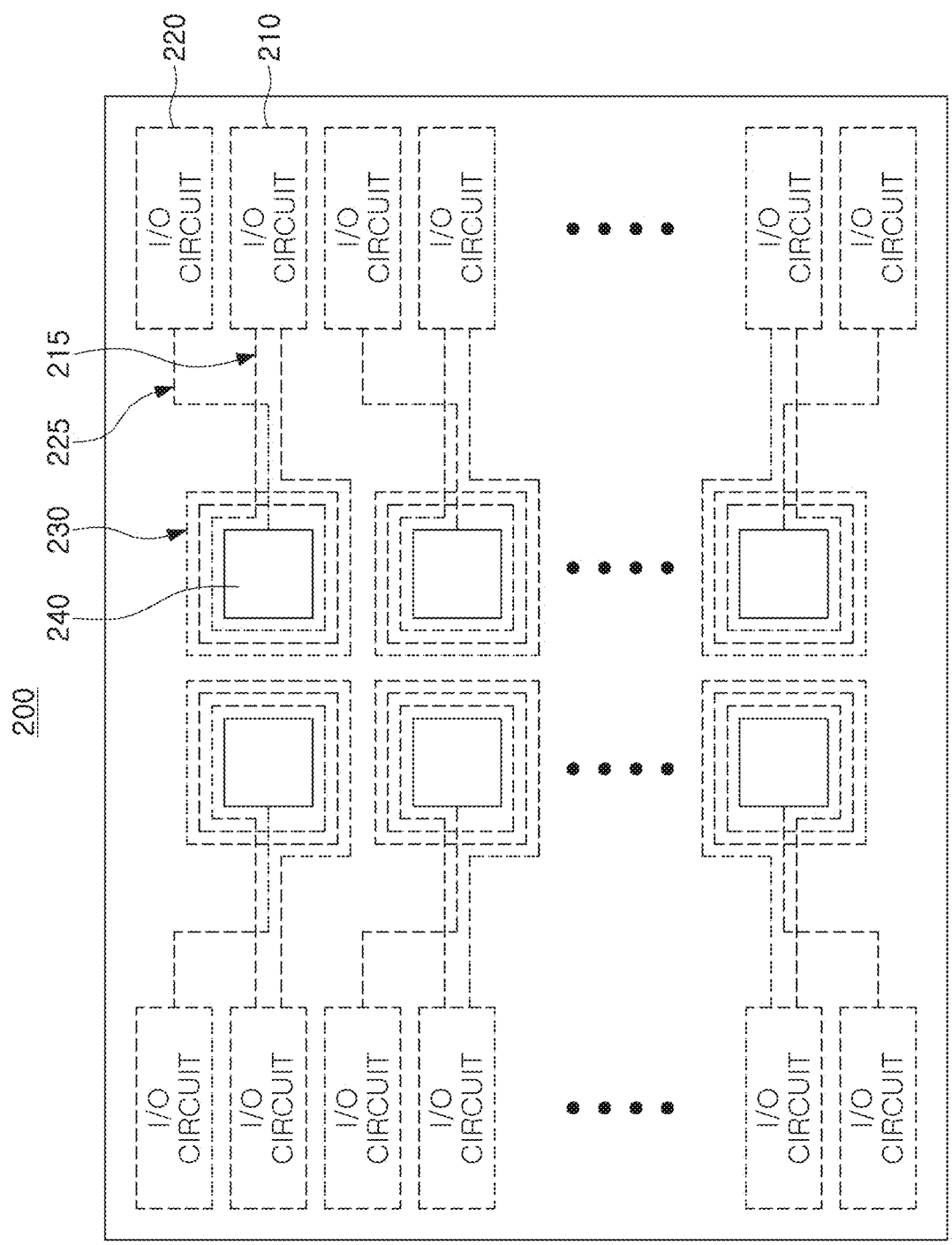
FIG. 11 is a diagram schematically illustrating a semiconductor device according to an example embodiment of the present inventive concepts.

FIG. 11 is a diagram schematically illustrating a semiconductor device according to an example embodiment of the present inventive concepts.

Referring to FIG. 11, a semiconductor device 200 according to an example embodiment of the present inventive concepts may include a plurality of I/O circuits 210 and 220, a plurality of coil patterns 230, and a plurality of via structures 240. Some I/O circuits 210 among the plurality of I/O circuits 210 and 220, may be connected to the coil patterns 230 and the other I/O circuits 220 may be connected to the via structures 240. The I/O circuits 210 and 220 may be connected to the coil patterns 230 and the via structures 240 through wiring patterns 215 and 225.

Each of the I/O circuits 210 and 220 may include at least one of a transmitter and a receiver. For example, when the semiconductor device 200 is a memory device, an I/O circuit for processing a data signal may include both a transmitter and a receiver to transmit and receive data signals to and from an external semiconductor device. Meanwhile, an I/O circuit for processing the data strobe signal or a clock signal may include only a receiver for receiving the data strobe signal or the clock signal from another external semiconductor device.

In an example embodiment illustrated in FIG. 11, a plurality of coil patterns 230 and a plurality of via structures 240 may be disposed in the center of the semiconductor device 200. However, this is only an example embodiment, and the plurality of coil patterns 230 and the plurality of via structures 240 may be disposed adjacent to the edge of the semiconductor device 200 may be distributed and disposed in the center and at the edge of the semiconductor device 200.

Also, the plurality of coil patterns 230 may be disposed to surround the plurality of via structures 240, respectively. In other words, the plurality of via structures 240 may be disposed in regions formed in the centers of the plurality of coil patterns 230, respectively. Since the plurality of coil patterns 230 surround the plurality of via structures 240, respectively, and signals are exchanged through the coil patterns 230 and the via structures 240, an I/O path for exchanging a lot of signals may be disposed in a limited area of the semiconductor device 200 and the degree of integration may be improved.

As described above, the coil patterns 230 may be aligned with coil patterns included in another semiconductor device. For example, the semiconductor device 200 may be stacked with another semiconductor device, and thus, the coil patterns 230 may overlap coil patterns of the another semiconductor device in a stacking direction. The I/O circuits 210 connected to the coil patterns 230 may output signals by changing polarity of an induced voltage induced in the coil pattern of the another semiconductor device by controlling a direction of a current flowing through each of the coil patterns 230. Also, the I/O circuits 210 may receive a signal according to the polarity of the induced voltage induced in each of the coil patterns 230.

At least one of the plurality of via structures 240 may be a TSV passing through a semiconductor substrate included in the semiconductor device 200. Accordingly, the plurality of via structures 240 may be formed over an element region and a wiring region included in the semiconductor device 200. Meanwhile, the plurality of coil patterns 230 may be provided by some of a plurality of wiring patterns formed in the wiring region.

Figure 12:
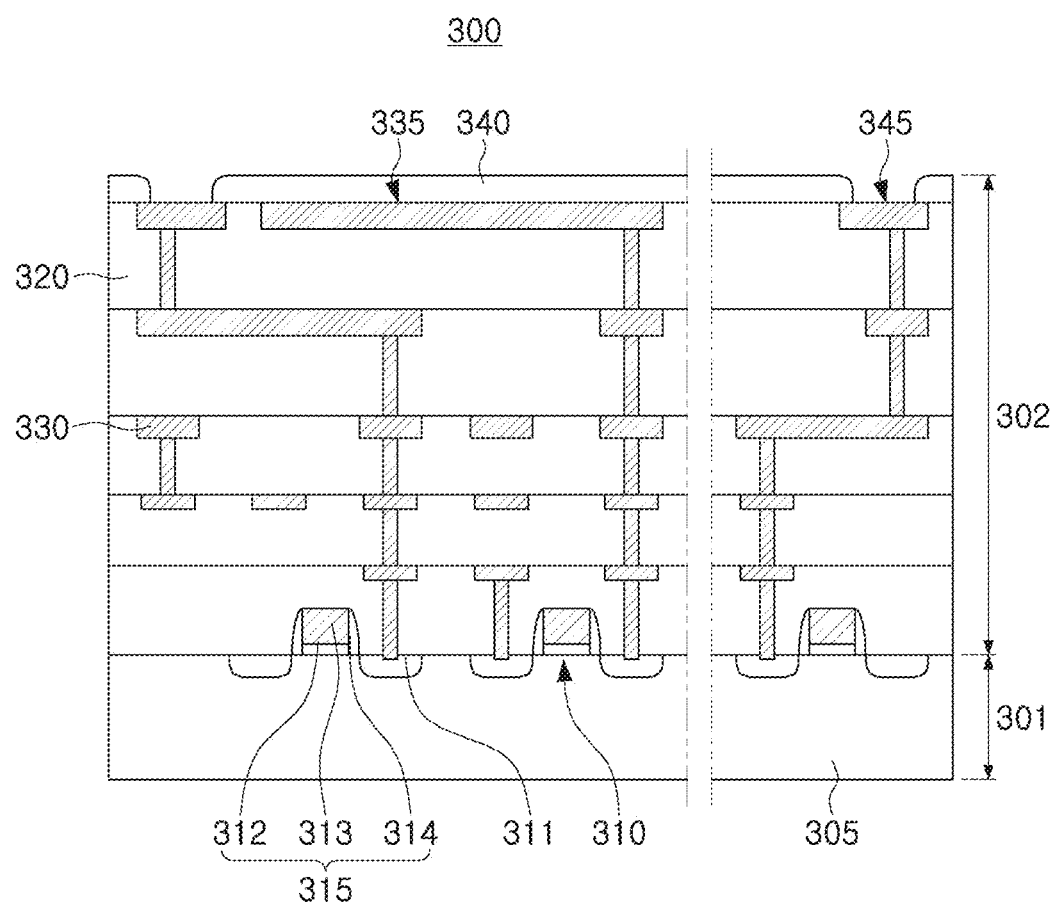
FIG. 12 is a schematic diagram schematically illustrating a semiconductor device according to an example embodiment of the present inventive concepts.

FIG. 12 is a schematic diagram illustrating a semiconductor device according to an example embodiment of the present inventive concepts.

Referring to FIG. 12, a semiconductor device 300 according to an example embodiment may include an element region 301 and a wiring region 302. The element region TRA may include a semiconductor substrate 305 and a plurality of elements 310 formed in the semiconductor substrate 305. Meanwhile, the wiring region 302 may include a plurality of interlayer insulating layers 320 formed on the semiconductor substrate 305 and a plurality of wiring patterns 330 covered by the plurality of interlayer insulating layers 320, and the like.

The plurality of elements 310 may include transistors formed in the semiconductor substrate 305. For example, each of the plurality of elements 310 may include a source/drain region 311 and a gate structure 315. The gate structure 315 may include a gate insulating layer 312, a gate electrode layer 313, and a gate spacer 314. A contact CNT may be connected to the source/drain region 311 and the gate structure 315, and the contact CNT may be connected to at least one of the plurality of wiring patterns 330.

The plurality of wiring patterns 330 may be divided to be disposed in a plurality of wiring layers, and the number of wiring layers may be variously modified. For example, the wiring patterns 330 disposed at the lowermost wiring layer may be connected to the plurality of elements 310 through the contact CNT. The plurality of wiring patterns 330 may have different thicknesses and widths depending on the wiring layers. For example, the thickness and width of the wiring patterns 330 disposed at the uppermost wiring layer may be greater than the thickness and width of the wiring patterns 330 disposed at the lowermost wiring layer.

The wiring region 302 may include a passivation layer 340 disposed on the uppermost wiring layer, and a portion of the wiring patterns 330 disposed on the uppermost wiring layer may be exposed to the outside by the passivation layer 340 to provide pads 345. In the example embodiment illustrated in FIG. 12, the pads 345 are illustrated as being disposed at the edges of the semiconductor device 300, but alternatively, the pads 345 may be disposed in the center of the semiconductor device 300.

Meanwhile, some of the plurality of wiring patterns 330 may provide a coil pattern 335. The coil pattern 335 may be a pattern provided for the purpose of allowing the semiconductor device 300 to exchange signals with other external semiconductor devices. When the semiconductor device 300 is stacked and packaged with another semiconductor device, the coil pattern 335 may be disposed to overlap a coil pattern included in the another semiconductor device.

In order for the coil pattern 335 to efficiently transmit and receive signals to and from the coil pattern of the another semiconductor device, it is necessary to increase inductance of the coil pattern 335 and a coupling coefficient with a coil pattern of the another semiconductor device. In an example embodiment illustrated in FIG. 12, the coil pattern 335 may be formed using some of the wiring patterns 330 of the uppermost wiring layer formed to have a relatively large width and thickness, thereby increasing inductance of the coil pattern 335. Meanwhile, the semiconductor element 310 connected to the coil pattern 335 may be a device included in an I/O circuit processing a signal transmitted/received through the coil pattern 335.

Figure 13:
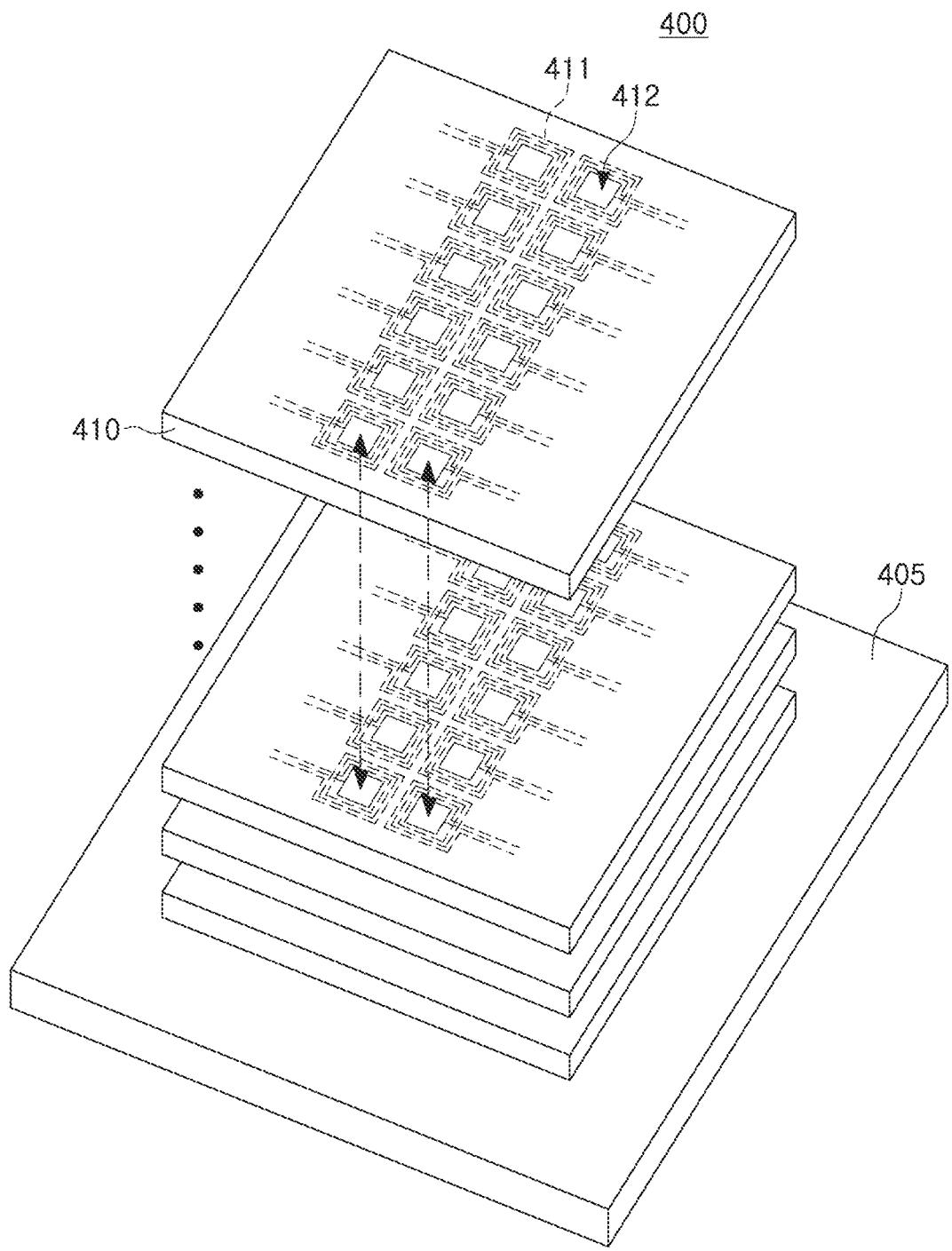
FIGS. 13 and 14 are diagrams schematically illustrating a semiconductor package according to an example embodiment of the present inventive concepts.
Figure 14:
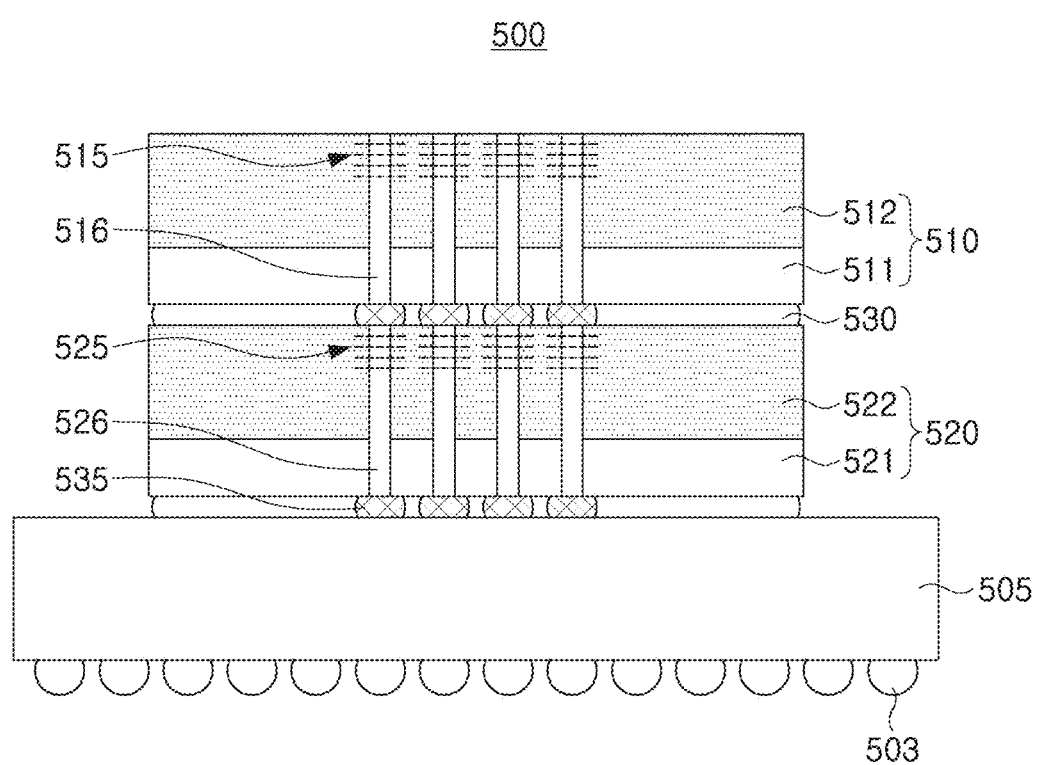

FIGS. 13 and 14 are diagrams schematically illustrating a semiconductor package according to an example embodiment of the present inventive concepts.

First, referring to FIG. 13, a semiconductor package 400 according to an example embodiment may include a package substrate 405 and a plurality of semiconductor devices 410 stacked on the package substrate 405. Each of the plurality of semiconductor devices 410 may be an integrated circuit chip, and may include a plurality of coil patterns 411 and a plurality of via structures 412 disposed in a partial region.

In the example embodiment illustrated in FIG. 13, the plurality of coil patterns 411 and the plurality of via structures 412 are shown to gather to be disposed in the center of each of the plurality of semiconductor devices 410, but alternatively, the plurality of coil patterns 411 and the plurality of via structures 412 may be disposed adjacent to edges of each of the semiconductor devices 410. The plurality of coil patterns 411 and the plurality of via structures 412 may provide signal transmission paths between the plurality of semiconductor devices 410.

Each of the plurality of semiconductor devices 410 may include a semiconductor substrate, an element region in which semiconductor elements formed on the semiconductor substrate are disposed, and a wiring region disposed on the element region and in which a plurality of wiring patterns connected to the semiconductor elements are disposed. The plurality of coil patterns 411 may be provided by some of the plurality of wiring patterns in the wiring region. When the plurality of semiconductor devices 410 are stacked on each other, a plurality of coil patterns 411 disposed in wiring regions in different semiconductor devices 410 may be aligned to overlap each other.

The plurality of via structures 412 may extend from the wiring region to the element region and may be TSVs passing through the semiconductor substrate. In a direction in which the plurality of semiconductor devices 410 are stacked, the via structures 412 disposed at the same position in different semiconductor devices 410 may be connected to each other.

Referring to FIG. 14, a semiconductor package 500 according to an example embodiment of the present inventive concepts may include a package substrate 505 and a plurality of semiconductor devices 510 and 520 stacked on the package substrate 505. The package substrate 505 includes a plurality of bumps 503 formed on a lower surface thereof and may be electrically connected to another semiconductor package through the plurality of bumps 503.

The plurality of semiconductor devices 510 and 520 may include a first semiconductor device 510 and a second semiconductor device 520, and the first semiconductor device 510 may include a first element region 511 and a first wiring region 512. Meanwhile, the second semiconductor device 520 may include a second element region 521 and a second wiring region 522.

Meanwhile, the first semiconductor device 510 may include first coil patterns 515 and first via structures 516, and the second semiconductor device 520 may include second coil patterns 525 and second via structures 526. As illustrated in FIG. 14, the first via structures 516 and the second via structures 526 may be connected to each other through micro-bumps 535 formed between the first semiconductor device 510 and the second semiconductor device 520. Also, the second via structures 526 may be connected to the package substrate 505 through micro-bumps 535 formed between the second semiconductor device 520 and the package substrate 505. A protective layer 530 for protecting the micro-bumps 535 from an external impact or the like may be further disposed between the first semiconductor device 510 and the second semiconductor device 520 and between the second semiconductor device 520 and the package substrate 505.

Referring to FIG. 14, each of the first via structures 516 and the second via structures 526 is formed over the element regions 511 and 521 and the wiring regions 512 and 522, and thus, the first via structures 516 and the second via structures 526 may pass through the semiconductor substrate included in the element regions 511 and 521. Also, the first via structures 516 may be surrounded by the first coil patterns 515, and the second via structures 526 may be surrounded by the second coil patterns 525.

A portion of the first via structures 516 and the second via structures 526 may provide a signal transmission path through which a signal is actually transmitted. Some of the first via structures 516 and the second via structures 526 providing the signal transmission path may be connected to at least one of the semiconductor elements disposed in the element regions 511 and 521 through the wiring regions 512 and 522.

For example, the first coil patterns 515 and the second coil patterns 525 may provide a signal transmission path for the first semiconductor device 510 and the second semiconductor device 520 to exchange data signals and clock signals. Meanwhile, at least one of the first via structures 516 and the second via structures 526 may provide a power transmission path through which a power voltage is transmitted between the first semiconductor device 510 and the second semiconductor device 520. For example, a power voltage supplied from the outside to the package substrate 505 may be input to the first semiconductor device 510 and the second semiconductor device 520 via at least one of the first via structures 516 and the second via structures 526. Also, according to example embodiments, some of the first via structures 516 and the second via structures 526 may provide a signal transmission path different from that of the coil patterns 515 and 525.

In the example embodiment illustrated in FIG. 14, the via structures 516 and 526 are shown to be disposed in the centers of the coil patterns 515 and 525, respectively, but alternatively, two or more via structures 516 and 526 may be disposed in the center of each of the coil patterns 515 and 525. In an example embodiment, an arrangement form of the coil patterns 515 and 525 and the via structures 516 and 526 may be various modified according to the cross-sectional area of each of the via structures 516 and 526, a space formed in the center of each of the coil patterns 515 and 525, and the like.

Figure 15:
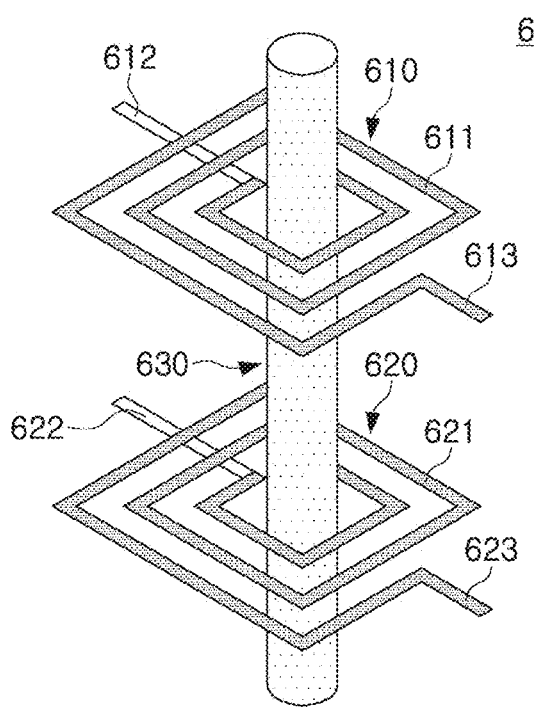
FIGS. 15 and 16 are diagrams schematically illustrating coil patterns included in semiconductor devices according to an example embodiment of the present inventive concepts.
Figure 16:
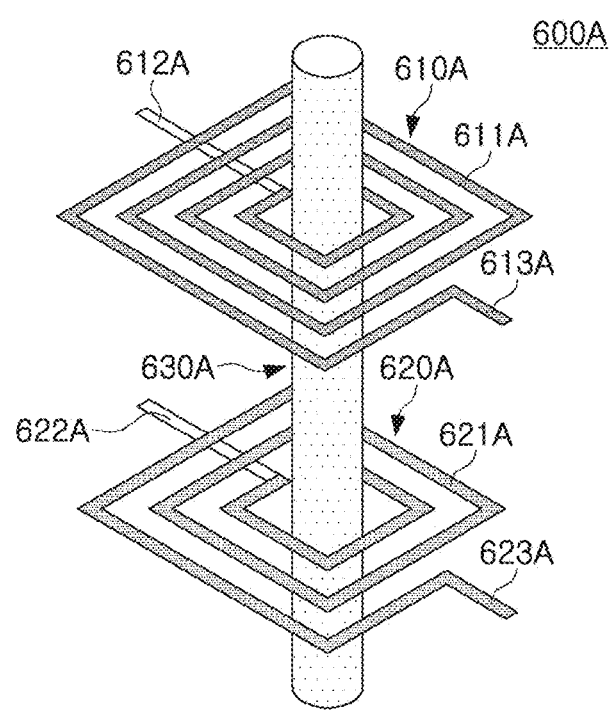

FIGS. 15 and 16 are diagrams schematically illustrating coil patterns included in semiconductor devices according to an example embodiment of the present inventive concepts.

First, referring to FIG. 15, coil patterns 600 included in semiconductor devices according to an example embodiment of the present inventive concepts may include a first coil pattern 610 and a second coil pattern 620. The first coil pattern 610 may be included in a first semiconductor device, and the second coil pattern 620 may be included in a second semiconductor device stacked with the first semiconductor device. The first coil pattern 610 and the second coil pattern 620 may be disposed parallel to each other and may overlap each other.

The first coil pattern 610 and the second coil pattern 620 may have the same structure. For example, the first coil pattern 610 may include a coil unit 611, a first lead line 612, a second lead line 613, and the like. The second coil pattern 620 may include a coil unit 621, a first lead line 622, and a second lead line 623. In each of the first coil pattern 610 and the second coil pattern 620, one of the first lead lines 612 and 622 and the second lead lines 613 and 623 may be disposed at the same height as the coil unit 611, and the other may be disposed at a different height from the coil unit 611. In an example embodiment illustrated in FIG. 15, the coil unit 611 of the first coil pattern 610 and the coil unit 621 of the second coil pattern 620 may have the same number of turns.

The first lead line 612 and the second lead line 613 of the first coil pattern 610 may be connected to an I/O circuit of the first semiconductor device. Similarly, the first lead line 622 and the second lead line 623 of the second coil pattern 620 may be connected to an I/O circuit of the second semiconductor device. When a signal is transmitted from the first semiconductor device to the second semiconductor device, a direction of a current flowing through the first coil pattern 610 may change according to a voltage applied to each of the first lead line 612 and the second lead line 613, and accordingly, a polarity of an induced voltage induced in the second coil pattern 620 may be changed. According to the polarity of the induced voltage, the second semiconductor device may determine data of a signal received from the first semiconductor device.

Meanwhile, the via structure 630 may pass through the center of the coil unit 611 of the first coil pattern 610 and the center of the coil unit 621 of the second coil pattern 620. As described above, the via structure 630 may provide a transmission path of a signal different from a signal transmitted/received using electromagnetic induction of the first coil pattern 610 and the second coil pattern 620. For example, the via structure 630 may be formed of a material having ferromagnetic characteristics to increase a coupling coefficient between the first coil pattern 610 and the second coil pattern 620.

Next, referring to FIG. 16, coil patterns 600A included in semiconductor devices according to an example embodiment of the present inventive concepts may include a first coil pattern 610A and a second coil pattern 620A. A structure of each of the first coil pattern 610A and the second coil pattern 620A is similar to that described above with reference to FIG. 15, and the via structure 630A may pass through the center of the first coil pattern 610A and the second coil pattern 620A.

However, in the example embodiment illustrated in FIG. 16, the number of turns of the first coil pattern 610A may be different from the number of turns of the second coil pattern 620A. Referring to FIG. 16, the number of turns of the first coil pattern 610A may be greater than the number of turns of the second coil pattern 620A. However, this is only an example, and the number of turns of the second coil pattern 620A may be greater than the number of turns of the first coil pattern 610A.

Figure 17:
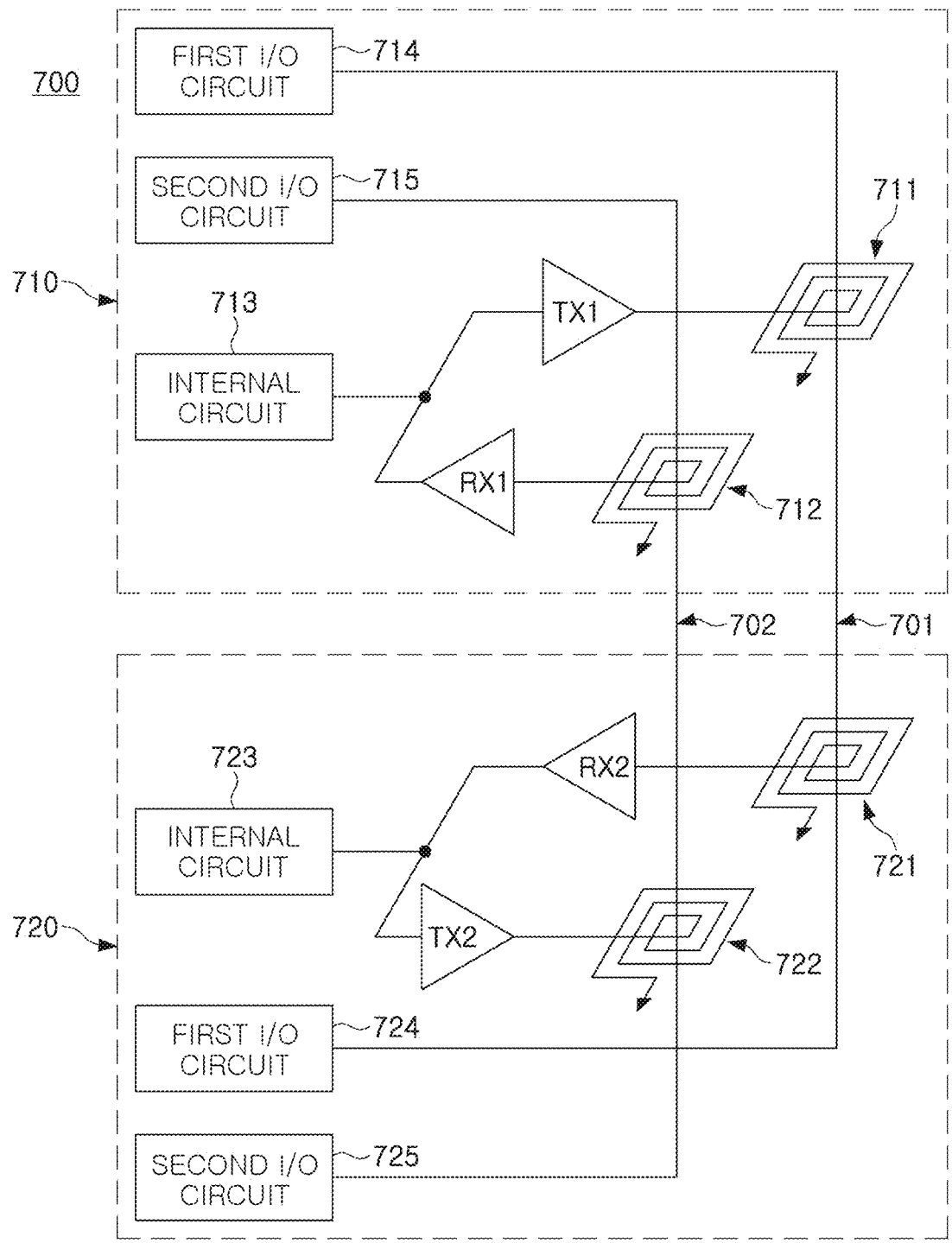
FIG. 17 is a diagram illustrating operations of semiconductor devices according to an example embodiment of the present inventive concepts.

FIG. 17 is a diagram illustrating operations of semiconductor devices according to an example embodiment of the present inventive concepts.

Referring to FIG. 17, a semiconductor package 700 according to an example embodiment may include a first semiconductor device 710 and a second semiconductor device 720. The first semiconductor device 710 may include a first coil pattern 711 and a second coil pattern 712, an internal circuit 713, a first I/O circuit 714 and a second I/O circuit 715, and the like. The first coil pattern 711 may be connected to the internal circuit 713 through a first transmitter Tx1, and the second coil pattern 712 may be connected to the internal circuit 713 through a first receiver Rx1.

The second semiconductor device 720 may have a structure similar to that of the first semiconductor device 710. The second semiconductor device 720 may include a first coil pattern 721, a second coil pattern 722, an internal circuit 723, a first I/O circuit 724, and a second I/O circuit 725, etc. The first coil pattern 721 may be connected to the internal circuit 723 through a second receiver Rx2, and the second coil pattern 722 may be connected to the internal circuit 723 through a second transmitter Tx2. In an example embodiment, when the first semiconductor device 710 and the second semiconductor device 720 are the same type of semiconductor devices, the internal circuit 713 of the first semiconductor device 710 may be the same as the internal circuit 723 of the second semiconductor device 720.

Referring to FIG. 17, the first coil pattern 711 of the first semiconductor device 710 may be coupled to the first coil pattern 721 of the second semiconductor device 720, and the second coil pattern 712 of the first semiconductor device 710 may be coupled to the second coil pattern 722 of the second semiconductor device 720. When the first semiconductor device 710 and the second semiconductor device 720 are stacked, the first coil patterns 711 and 721 may overlap each other and the second coil patterns 712 and 722 may overlap each other.

The internal circuit 713 of the first semiconductor device 710 may adjust a direction of a current flowing through the first coil pattern 711 through the first transmitter Tx1, and accordingly, a polarity of the induced voltage induced in the coil pattern 721 of the second semiconductor device 720 may change. The second receiver Rx2 of the second semiconductor device 720 may compare the induced voltage of the first coil pattern 721 with a reference voltage, and the internal circuit 723 may receive data for the first semiconductor device 710 to transmit to the first transmitter Tx1 based on an output of the second receiver Rx2.

Similarly, the internal circuit 723 of the second semiconductor device 720 may control a direction of a current flowing through the second coil pattern 722 through the second transmitter Tx2, and accordingly, a polarity of an induced voltage induced in the second coil pattern 712 of the first semiconductor device 710 may change. The first receiver Rx1 of the first semiconductor device 710 may compare the induced voltage of the second coil pattern 712 with a reference voltage, and the internal circuit 713 may receive data for the second semiconductor device 720 to transmit to the second transmitter Tx2 based on an output of the first receiver Rx1.

Meanwhile, a first via structure 701 may be disposed in the center of the first coil patterns 711 and 721, and a second via structure 702 may be disposed in the center of the second coil patterns 712 and 722. The first via structure 701 may be connected to a first I/O circuit 714 of the first semiconductor device 710 and a first I/O circuit 724 of the second semiconductor device 720. The second via structure 702 may be connected to a second I/O circuit 715 of the first semiconductor device 710 and a second I/O circuit 725 of the second semiconductor device 720. According to an example embodiment, a plurality of via structures may be disposed at each of the centers of the first coil patterns 711 and 721 and the centers of the second coil patterns 712 and 722 unlike those illustrated FIG. 17.

Each of the first via structure 701 and the second via structure 702 may provide a transmission path for a signal different from that of the first coil patterns 711 and 721 and the second coil patterns 712 and 722. For example, when the first semiconductor device 710 is a semiconductor device operating as a host and the second semiconductor device 720 is a memory device such as a DRAM, the first semiconductor device 710 may output a data signal to the second semiconductor device 720 through the first coil pattern 711 and receive a data signal from the second semiconductor device 720 through the second coil pattern 712. Also, the second semiconductor device 720 may operate upon receiving a power voltage from the first semiconductor device 710 through the first via structure 701 and the second via structure 702.

Figure 18:
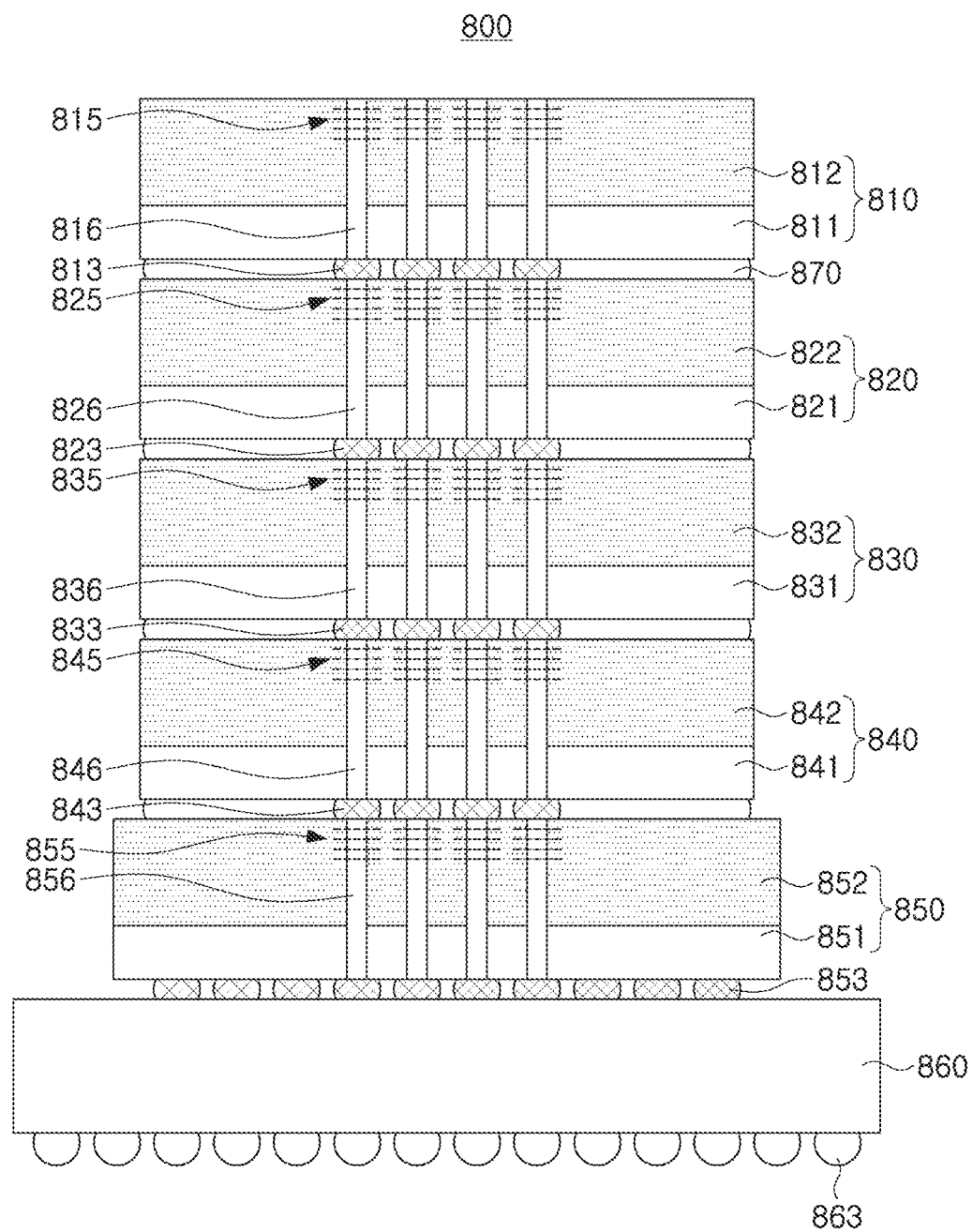
FIGS. 18 and 19 are diagrams schematically illustrating a semiconductor package according to an example embodiment of the present inventive concepts.
Figure 19:
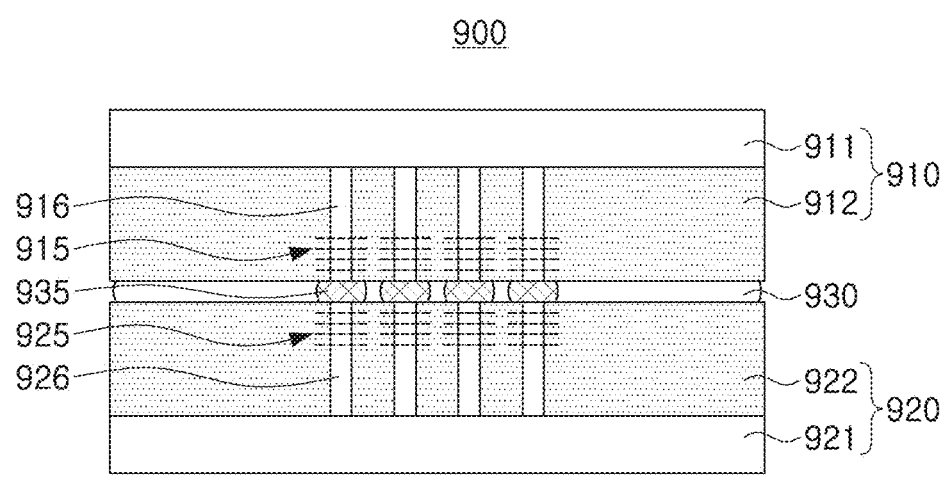

FIGS. 18 and 19 are diagrams schematically illustrating a semiconductor package according to an example embodiment of the present inventive concepts.

First, referring to FIG. 18, a semiconductor package 800 according to an example embodiment of the present inventive concepts may include a package substrate 805 and a plurality of semiconductor devices 810 to 850 stacked on the package substrate 805. The package substrate 805 may be mounted on a system substrate or the like through a plurality of bumps 503 formed on a lower surface thereof and may be electrically connected to other semiconductor packages.

At least one of the plurality of semiconductor devices 810 to 850 may be different from other semiconductor devices. In an example embodiment illustrated in FIG. 18, the first to fourth semiconductor devices 810 to 840 may be the same type of semiconductor devices, and a fifth semiconductor device 850 may be a different type of semiconductor device from the first to fourth semiconductor devices 810 to 840. For example, each of the first to fourth semiconductor devices 810 to 840 may be memory chips, and a fifth semiconductor device 850 may be a controller chip controlling the memory chips.

The fifth semiconductor device 850 may be mounted on the package substrate 805 through a plurality of micro-bumps 853. In some example embodiments, an interposer substrate may be disposed between the fifth semiconductor device 850 and the package substrate 805.

The first to fourth semiconductor devices 810 to 840 may be implemented as memory devices having the same capacity and may have the same structure. Referring to the first semiconductor device 810 as an example, the first semiconductor device 810 may include an element region 811 and a wiring region 812, and the wiring region 812 may include a plurality of coil patterns 815. Also, the first semiconductor device 810 may include a plurality of via structures 816 passing through the element region 811 and the wiring region 812. The plurality of via structures 816 of the first semiconductor device 810 may be connected to the plurality of via structures 826 of the second semiconductor device 820 through a plurality of micro-bumps 813 on a lower surface thereof. A protective layer 870 for protecting the micro-bumps 813, 823, 833, and 843 may be formed between the plurality of semiconductor devices 810 to 850.

Via structures 846 of the fourth semiconductor device 840 disposed closest to the package substrate 805, among the first to fourth semiconductor devices 810 to 840, may be connected to the via structures 856 of the fifth semiconductor device 850. The via structures 856 of the fifth semiconductor device 850 may be connected to the package substrate 805 through some of the plurality of micro-bumps 853. Also, at least a portion of the via structures 856 of the fifth semiconductor device 850 may be connected to a semiconductor element inside the fifth semiconductor device 850.

In each of the plurality of semiconductor devices 810 to 850, a plurality of via structures 816, 826, 836, 846, and 856 may be surrounded by a plurality of coil patterns 815, 825, 835, 845, and 855. As described above, the plurality of semiconductor devices 810 to 850 may exchange signals with each other through a plurality of coil patterns 815, 825, 835, 845, and 855 and a plurality of via structures 816, 826, 836, 846, and 856. Accordingly, a maximum number of signal transmission paths between the plurality of semiconductor devices 810 to 850 may be arranged in a limited area, and the degree of integration of the semiconductor package 800 may be improved.

Next, referring to FIG. 19, a semiconductor package 900 according to an example embodiment may include a first semiconductor device 910 and a second semiconductor device 920. A structure of each of the semiconductor devices 910 and 920 included in the semiconductor package 900 may be similar to that described above with reference to FIG. 18. Referring to the first semiconductor device 910 as an example, the first semiconductor device 910 may include an element region 911 and a wiring region 912, and a plurality of coil patterns 915 may be disposed in the wiring region 912. Also, the first semiconductor device 910 may include a plurality of via structures 916 passing through the plurality of coil patterns 915.

However, in the example embodiment illustrated in FIG. 19, the first semiconductor device 910 and the second semiconductor device 920 may be stacked so that the wiring region 912 of the first semiconductor device 910 and a wiring region 922 of the second semiconductor device 920 may be adjacent to each other. In other words, the wiring regions 912 and 922 may be disposed between the element regions 911 and 921. A plurality of via structures 916 and 926 may be connected to each other through a plurality of micro-bumps 935 between the wiring regions 912 and 922 adjacent to each other. In order to protect the plurality of micro-bumps 935 from an external impact, a protective layer 930 may be inserted between the wiring regions 912 and 922.

Also, referring to FIG. 19, the plurality of via structures 916 and 926 passing through the plurality of coil patterns 915 and 925 may not extend to the element regions 911 and 921. Since the wiring regions 912 and 922 are disposed between the element regions 911 and 921 including a semiconductor substrate, the plurality of via structures 916 and 926 may not be formed in the form of TSVs passing through the semiconductor substrate. However, when another semiconductor device is disposed on the first semiconductor device 910 or another semiconductor device is disposed below the second semiconductor device 920, a portion of the plurality of via structures 916 and 926 may be formed as a TSV passing through up to the element regions 911 and 921. Alternatively, in order to connect pads formed on the element region 911 of the first semiconductor device 910 to the plurality of via structures 916 or in order to connect pads formed below the element region 921 of the second semiconductor device 920, a portion of the plurality of via structures 916 and 926 may be formed as TSVs.

Figure 20:
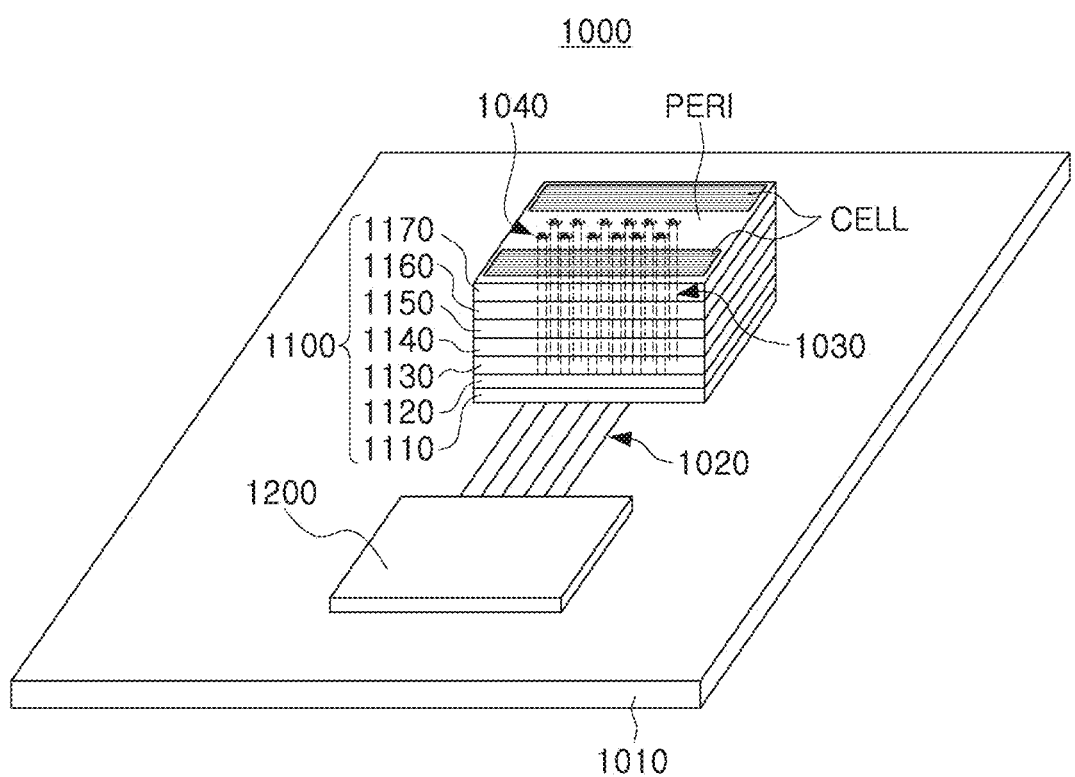
FIG. 20 is a schematic diagram illustrating a memory system according to an example embodiment of the present inventive concepts.

FIG. 20 is a schematic diagram illustrating a memory system according to an example embodiment of the present inventive concepts.

Referring to FIG. 20, a memory system 1000 according to an example embodiment of the present inventive concepts may include at least one memory package 1100 and a host device 1200. The memory package 1100 may include a plurality of memory devices 1110 to 1170.

Each of the plurality of memory devices 1110 to 1170 may include a peripheral circuit region PERI and a cell region CELL. A plurality of memory cells may be disposed in the cell region CELL. A word line decoder connected to the plurality of memory cells through word lines, a sense amplifier circuit connected to the plurality of memory cells through bit lines, and a logic circuit writing data to the plurality of memory cells or reading data from the plurality of memory cells, and the like, may be disposed in the peripheral circuit region PERI.

The plurality of memory devices 1110 to 1170 may be connected to the host device 1200 through wiring patterns 1020 formed on a printed circuit board (PCB) 1010. The host device 1200 may be implemented as a central processing unit, a graphic processing unit, a system-on-chip, or the like, and may control operations of the plurality of memory devices 1110 to 1170.

Meanwhile, each of the plurality of memory devices 1110 to 1170 may include a plurality of via structures 1030 formed of TSVs and a plurality of coil patterns 1040 formed around the plurality of via structures 1030 to surround the plurality of via structures 1030. The plurality of memory devices 1110 to 1170 and the host device 1200 may exchange signals with each other through the plurality of via structures 1030 and the plurality of coil patterns 1040.

In an example embodiment illustrated in FIG. 20, the host device 1200 and the memory package 1100 are disposed at different positions on the PCB 1010, and thus, the host device 1200 and the memory package 1100 may be connected by the wiring patterns 1020 of the PCB 1010. However, in some example embodiments, the host device 1200 may be directly mounted on the PCB 1010, and the memory package 1100 may be stacked on the host device 1200. When the memory package 1100 is stacked on the host device 1200, the host device 1200 may include at least one TSV connecting the memory package 1100 to the PCB 1010.

According to an example embodiment of the present inventive concepts, some signals may be transmitted and received between semiconductor devices by an electromagnetic induction phenomenon caused by a current flowing in a coil pattern connected to a pad, and the semiconductor devices may exchange a signal different from a signal transmitted to the coil pattern with each other through a via structure passing through the center of the coil pattern. Accordingly, since more signals may be exchanged in a limited area of the semiconductor device, the degree of integration and performance of the semiconductor device, the semiconductor package, and the memory system may be improved.

While example embodiments have been shown and described above, it will be apparent to those skilled in the art that modifications and variations could be made without departing from the scope of the present inventive concepts as defined by the appended claims.

What is claimed is:
1. A semiconductor device comprising:
   an element region including a semiconductor substrate and a plurality of elements formed on the semiconductor substrate; and
   a wiring region disposed on the element region and including an interlayer insulating layer, a plurality of wiring patterns in the interlayer insulating layer, and a via structure extending in a first direction in the interlayer insulating layer, the first direction being perpendicular to an upper surface of the semiconductor substrate, wherein the plurality of elements includes a first input/output (I/O) circuit transmitting and receiving a first signal and a second I/O circuit transmitting and receiving a second signal, different from the first signal, the plurality of wiring patterns includes a coil pattern providing an inductor circuit, the coil pattern is connected to the first I/O circuit, and the via structure passes through a center of the coil pattern and is connected to the second I/O circuit.

2. The semiconductor device of claim 1, wherein the first signal is a data signal, and the second signal is a power voltage signal.

3. The semiconductor device of claim 1, wherein the first signal is a clock signal and the second signal is a data signal transmitted and received by the second I/O circuit in synchronization with the first signal.

4. The semiconductor device of claim 1, wherein the via structure is a through-silicon via (TSV) passing through the semiconductor substrate.

5. The semiconductor device of claim 1, wherein the via structure includes a plurality of via structures, the second I/O circuit includes a plurality of second transmitters outputting different signals, and the plurality of via structures are connected to the plurality of second transmitters, respectively.

6. The semiconductor device of claim 1, wherein the via structure includes a plurality of via structures, the second I/O circuit includes a plurality of second transmitters outputting different signals, and at least one via structure of the plurality of via structures is separated from the plurality of second transmitters, and other via structures of the plurality of via structures are connected to the plurality of second transmitters, respectively.

7. The semiconductor device of claim 6, wherein the at least one via structure includes a first material, and the other via structures include a second material different from the first material.

8. The semiconductor device of claim 7, wherein the first material is a ferromagnetic material, and the second material has a first resistivity lower than a second resistivity of the first material.

9. The semiconductor device of claim 6, wherein the at least one via structure is disposed between the other via structures in a second direction, and the second direction is parallel to the upper surface of the semiconductor substrate.

10. The semiconductor device of claim 6, wherein a width of the at least one via structure is different from a width of each of the other via structures in a second direction, and the second direction is parallel to the upper surface of the semiconductor substrate.

11. The semiconductor device of claim 1, wherein the first I/O circuit is configured to output the first signal by adjusting a direction of a current flowing through the coil pattern.

12. A semiconductor package comprising:

a package substrate; and a first semiconductor device and a second semiconductor device stacked in a first direction, the first direction being perpendicular to an upper surface of the package substrate, wherein each of the first semiconductor device and the second semiconductor device includes a semiconductor substrate, a plurality of via structures passing through the semiconductor substrate, a coil pattern surrounding at least one via structure of the plurality of via structures in a second direction, and an input/output (I/O) circuit connected to at least one of the plurality of via structures and the coil pattern, and the second direction is parallel to an upper surface of the semiconductor substrate, the at least one via structure provides a first transmission path of a first signal, and the coil pattern provides a second transmission path of a second signal, different from the first signal.

13. The semiconductor package of claim 12, wherein the coil pattern surrounds two or more via structures of the plurality of via structures, and the two or more via structures provide data transmission paths of different data signals.

14. The semiconductor package of claim 13, wherein the coil pattern provides a third transmission path of a data strobe signal for exchanging the data signals.

15. The semiconductor package of claim 12, wherein the coil pattern of the first semiconductor device is connected to an output terminal of a transmitter, and the coil pattern of the second semiconductor device is connected to an input terminal of a receiver.

16. The semiconductor package of claim 12, wherein each of the first semiconductor device and the second semiconductor device includes a first coil pattern, a second coil pattern, a transmitter having an output terminal connected to the first coil pattern, and a receiver having an input terminal connected to the second coil pattern, the first coil pattern of the first semiconductor device is coupled to the second coil pattern of the second semiconductor device, and the second coil pattern of the first semiconductor device is coupled to the first coil pattern of the second semiconductor device.

17. The semiconductor package of claim 16, wherein the number of turns of the first coil pattern of the first semiconductor device is same as the number of turns of the second coil pattern of the second semiconductor device, and the number of turns of the second coil pattern of the first semiconductor device is same as the number of turns of the first coil pattern of the second semiconductor device.

18. The semiconductor package of claim 12, wherein the I/O circuit of at least one of the first semiconductor device and the second semiconductor device includes a transmitter, a receiver, a transmission switch connected between an output terminal of the transmitter and the coil pattern, and a reception switch connected to an input terminal of the receiver and the coil pattern.

19. A memory system comprising:

a printed circuit board (PCB);

a host device on the PCB; and a memory package on the PCB, the memory package including a plurality of memory devices stacked on each other, and connected to the host device, wherein the plurality of memory devices includes a plurality of through-silicon vias (TSVs) and a plurality of coil patterns surrounding at least one of the plurality of TSVs, and the plurality of memory devices exchange signals with the host device through the plurality of TSVs and the plurality of coil patterns.

20. The memory system of claim 19, wherein the host device and the memory package are arranged at different positions on the PCB.

* * * * *